US006967514B2

(12) United States Patent
Kizer et al.

(10) Patent No.: US 6,967,514 B2
(45) Date of Patent: Nov. 22, 2005

(54) METHOD AND APPARATUS FOR DIGITAL DUTY CYCLE ADJUSTMENT

(75) Inventors: Jade M. Kizer, Mountain View, CA (US); Roxanne T. Vu, San Jose, CA (US)

(73) Assignee: Rambus, Inc., Los Altos, CA (US)

( * ) Notice: Subject to any disclaimer, the term of this patent is extended or adjusted under 35 U.S.C. 154(b) by 47 days.

(21) Appl. No.: 10/277,738

(22) Filed: Oct. 21, 2002

(65) Prior Publication Data

US 2004/0075462 A1 Apr. 22, 2004

(51) Int. Cl.[7] ............................................. H03K 3/17
(52) U.S. Cl. ..................................... 327/175; 327/299
(58) Field of Search ................................ 327/172–175, 327/176, 108–114, 299; 375/238, 241

(56) References Cited

U.S. PATENT DOCUMENTS 5,008,636 A * 4/1991 Markinson et al. ............ 331/2
5,572,158 A * 11/1996 Lee et al. ................... 327/175
6,040,726 A 3/2000 Martin
6,084,452 A 7/2000 Drost et al.
6,320,437 B1 * 11/2001 Ma ........................... 327/175
6,342,801 B1 1/2002 Shin
6,366,115 B1 4/2002 DiTommaso
6,373,308 B1 4/2002 Nguyen
6,373,309 B1 * 4/2002 Bang .......................... 327/175
6,384,652 B1 5/2002 Shu
6,411,145 B1 6/2002 Kueng et al.
6,424,178 B1 7/2002 Harrison
6,426,660 B1 7/2002 Ho et al.
6,448,828 B2 9/2002 Stark et al.
6,452,432 B2 9/2002 Kim
6,459,314 B2 10/2002 Kim
6,466,071 B2 10/2002 Kim et al.
6,486,723 B1 11/2002 DeRyckere et al.
6,501,313 B2 12/2002 Boerstler et al.
6,518,809 B1 2/2003 Kotra
6,535,040 B2 3/2003 Jung et al.
6,535,051 B2 3/2003 Kim
6,566,918 B1 5/2003 Nguyen
6,566,925 B2 5/2003 Ma
6,583,657 B1 6/2003 Eckhardt et al.
6,593,789 B2 7/2003 Atallah et al.
6,603,337 B2 8/2003 Cho
6,636,098 B1 10/2003 Kizer

* cited by examiner

*Primary Examiner*—Minh Nguyen
(74) *Attorney, Agent, or Firm*—McDonnell Boehnen Hulbert & Berghoff LLP

(57) ABSTRACT

Adjusting a clock duty cycle. An incremental error signal is generated in response to the clock signal. A cumulative error signal is generated in response to the incremental error signal. The incremental error signal is reset and the duty cycle of the clock signal is adjusted in response to the cumulative error signal.

78 Claims, 10 Drawing Sheets

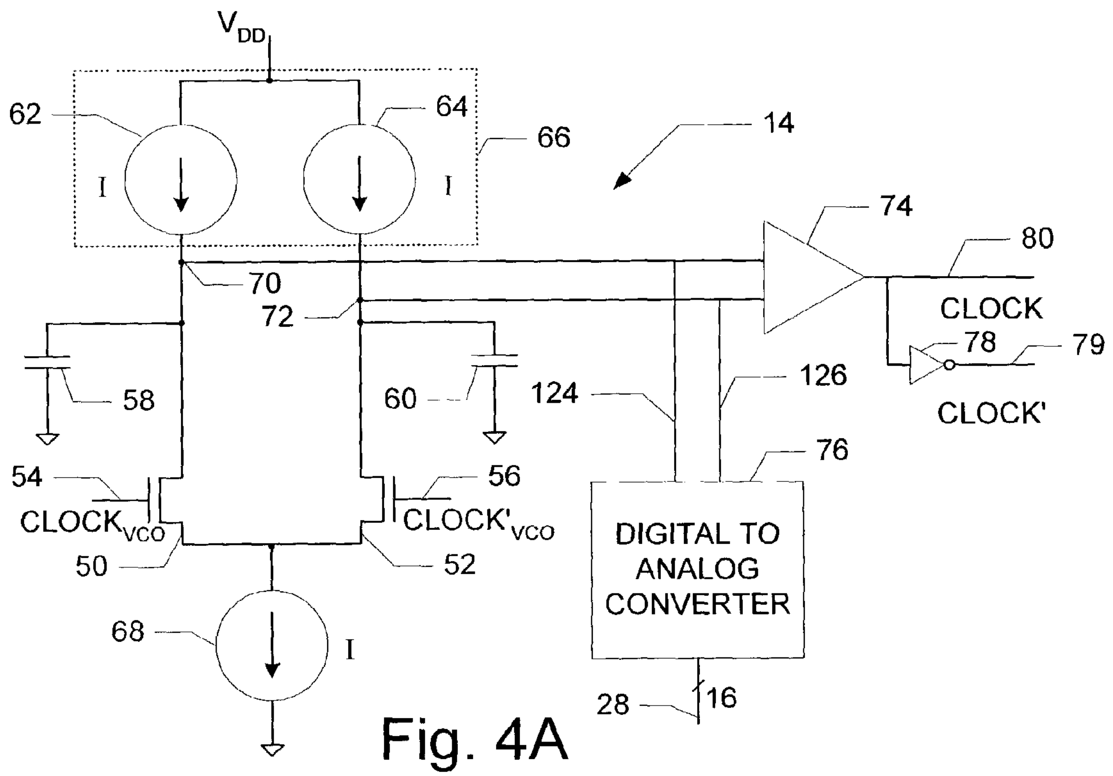
Fig. 4A
Fig. 4B
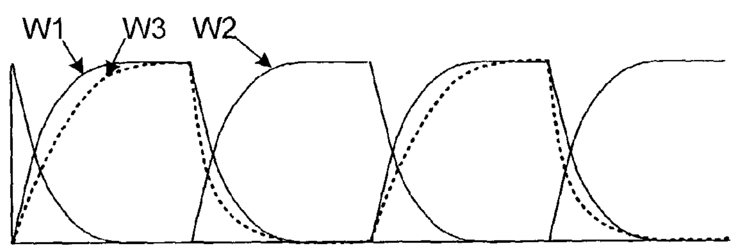
Fig. 4C
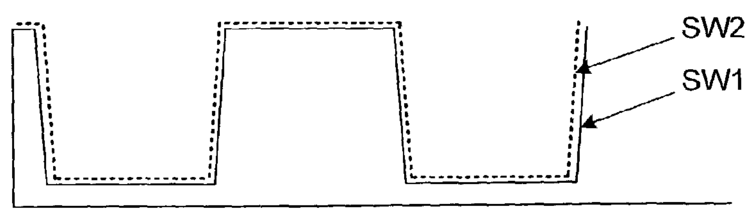

METHOD AND APPARATUS FOR DIGITAL DUTY CYCLE ADJUSTMENT

FIELD OF THE INVENTION

The present invention relates generally to the field of clock signal duty cycle control devices and methods. More particularly, the present invention relates to methods and apparatuses for correcting, adjusting or maintaining a clock signal duty cycle using a digital feedback mechanism.

BACKGROUND OF THE INVENTION

All electronic systems include communication channels for transmitting signals from one component to another. Many electronic systems use clock signals to time the transmission of such signals. In such systems it is important that the duty cycle of clock signal be maintained at a desired ratio. For example, in most computer systems it is important that the clock signal is maintained at a specified duty cycle.

Computer systems generally include a memory subsystem that contains memory devices where instructions and data are held for use by a processor of the computer system. Because the processor is typically capable of operating at a higher rate than the memory subsystem, the operational speed of the memory subsystem has a significant impact on the performance of the computer system.

In the past, the memory devices making up the memory subsystem, such as Dynamic Random Access Memory ("DRAM"), were typically asynchronous devices, i.e., the memory devices stored or output data in response to control signals from a processor. However, asynchronous operation results in a delay between the time that a control signal, e.g., a read command and address value, is received by the memory device and the time that the device responds, e.g., the data becomes available at the output of the memory device. An approach that has been developed to improve memory performance is called double data-rate ("DDR") and is used in DDR DRAM memory devices. In a DDR DRAM, data during a burst is output on both the rising and falling edges of the clock cycles, which effectively doubles the rate of operational frequency of the memory subsystem.

A DDR memory controller typically contains a clock generation circuit that is configured to generate a clock signal. Frequently, the clock generation circuit is a high-speed, low-jitter clock source that generates a high-speed clock signal CLK0. The clock generation circuit may be an "on-chip" clock generation source or an "off-chip" clock generation source. If an "on-chip" clock generation circuit is used, the circuit may employ a phase-locked loop ("PLL") with an "off-chip" signal used as a reference. In such an embodiment, the PLL may multiply the clock frequency of the reference signal to obtain a desired high-frequency clock signal.

The clock generation circuit may derive a lower frequency clock signal by using a divider that divides the high-speed clock signal to generate a lower-frequency clock signal that is then output to the DDR memory device. The divider may divide the frequency of the high-speed clock signal by an integer N.

Because data is transferred on both edges of the clock signal in a DDR system, it is desirable, and in some cases necessary, to have a 50% duty cycle. Because of the very high rate of switching associated with the data transfers, the tolerance on duty cycle errors is quite small. Even small errors in a clock's duty cycle can impose a significant reduction on system performance.

Typical duty cycle correction circuits may utilize a field effect transistor ("FET") based charge pump to generate a voltage that is provided to a shaping circuit via an analog feedback circuit, which is then used to modify the duty cycle. When the desired duty cycle is achieved, the feedback voltage generated from the charge pump stabilizes and remains constant at a value that provides the required correction via the analog feedback circuit. One disadvantage of such a system is that the voltage difference in the charge pump nodes induces an error within the charge pump. Specifically, current characteristics of transistor devices used within the charge pump may vary slightly as the voltages vary. For example, varying drain-to-source voltages can have an effect on the FET channel length, referred to as channel length modulation, which in turn effects the drain-to-source current. Thus, in a charge pump device relied upon to detect small variations in duty cycle based on small changes in FET currents, any voltage variations that may induce channel length modulation in the charge pump FETs may cause the circuit to indicate a locked condition when in fact a small duty cycle offset is present.

Thus, there is a need to more precisely control clock signal duty cycles.

BRIEF DESCRIPTION OF THE DRAWINGS

Exemplary embodiments of the present invention are described with reference to the following drawings, in which:

FIG. 4A is a preferred embodiment of a duty cycle shaping circuit;

FIGS. 4B and 4C depict waveforms associated with the duty cycle shaping circuit of FIG. 4A;

DETAILED DESCRIPTION OF THE INVENTION

Figure 1A:
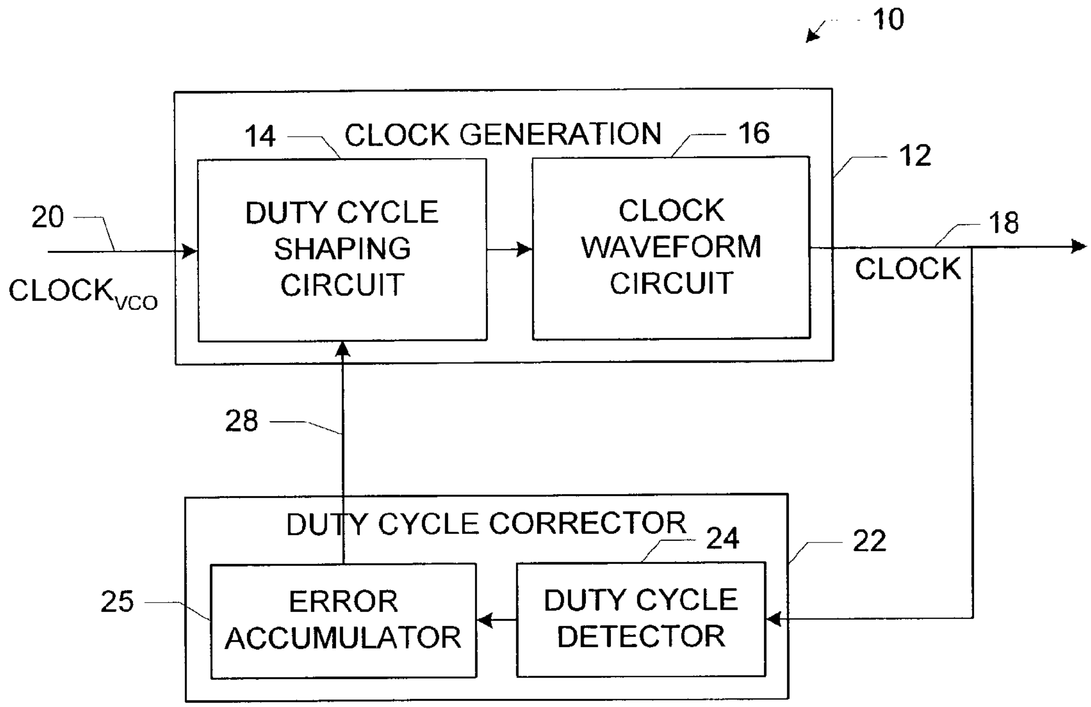
FIGS. 1A and 1B are preferred embodiments of a duty cycle adjustment circuit.

In accordance with a first aspect of the present invention, a method for adjusting, correcting or maintaining a clock's duty cycle is provided. An incremental error signal is generated in response to the clock signal, and a cumulative error signal is generated in response to the incremental error signal. The duty cycle of the clock signal is adjusted in response to the cumulative error signal.

In one preferred embodiment, the duty cycle adjuster, or duty cycle correction circuit, detects a duty cycle error with an analog detector, (such as, for example, a charge pump) but then accumulates the error in a digital fashion. Because the detector does not also serve as an error accumulator, the detector can be repeatedly reset and operated over a small range of output voltages. The analog detector, having a small dynamic range, may be designed to provide very accurate indications of a duty cycle error. The analog detector, which may be implemented as an analog detector circuit, may also be programmable, thereby providing a duty cycle adjuster that can be used to provide any desired duty cycle in a dynamic manner.

Furthermore, because some preferred embodiments of the accumulator operate in a digital fashion, it can be used to implement duty cycle correction algorithms, including filtering, state-based filtering, fast relock based on previous lock information, adjustments based on temperature, lock searching algorithms, etc.

In accordance with another embodiment, the present invention provides a duty cycle adjuster which may be used to do one or more of adjust, correct and control the duty cycle of a clock signal. The duty cycle adjuster of this embodiment may also be used to adjust, correct and/or control the duty cycle of other periodic signals that are used for other purposes other than providing a clock signal. The duty cycle adjuster of the present invention may include a clock generator that provides a clock waveform signal. The clock generator has a duty cycle correction input. In various embodiments, the duty cycle correction input may be a digital (e.g., binary) signal or in the form of an analog signal. The duty cycle adjuster of the present embodiment also includes a duty cycle detector, which preferably includes a charge pump that generates a voltage in the presence of a duty cycle error and an analog to digital converter for generating a digital incremental error measurement responsive to the voltage. The duty cycle detector may also be configured to generate an analog error voltage or a digital signal used to fine tune the clock generator.

In addition, the duty cycle adjuster of the present embodiment includes a duty cycle error accumulator connected to the duty cycle detector, wherein the duty cycle error accumulator generates a duty cycle correction signal representing an accumulated error measurement in response to the digital incremental error measurement. The duty cycle error accumulator also provides the duty cycle correction signal to the duty cycle correction input. The charge pump may be selectively reset, resulting in the voltage remaining substantially within a predetermined range when the duty cycle correction signal representing an accumulated error measurement is sufficient to obtain a desired duty cycle. Persons skilled in the art will recognize that the clock generator, the duty cycle detector and the duty cycle error accumulator may be implemented, respectively, as a clock generation circuit, a duty cycle detection circuit and a duty cycle error accumulation circuit.

In various embodiments, the duty cycle adjuster or duty cycle correction circuit of the present invention may utilize an incremental error measurement in the form of a multiple bit signal representing a quantization value corresponding to the duty cycle error voltage. The error voltage is preferably reset using a switch, typically a FET device, and may be reset when the quantization value exceeds a predetermined threshold.

The duty cycle adjuster may include a comparator connected to the charge pump. The comparator preferably includes two thresholds for detecting a high or low voltage. In an alternative embodiment, the duty cycle adjuster may utilize an incremental error measurement that is output in the form of a logic value, wherein a first logic value, for example a logic 1, indicates a positive error and second logic value, for example a logic 0, indicates a negative error. The incremental error measurement may be a quantized multi-bit digital value obtained via an analog to digital converter. This multi-bit value could be used to help determine the best next digital duty cycle correction value, thus speeding lock time or increasing accuracy of the overall duty cycle corrector.

The duty cycle adjuster may include a duty cycle shaping circuit and a clock waveform circuit, where the shaping circuit has a first and second capacitor and a differential amplifier, together with a digital to analog converter, wherein the digital to analog converter receives the duty cycle correction signal and responsively adjusts current flow to the first and second capacitors. The current is adjusted in such a manner that the rise time of the first capacitor and the fall time of the second capacitor change in one direction, and the fall time of the first capacitor and the rise time of the second capacitor change in the opposite direction, thereby adjusting the duty cycle of the signal in a well defined manner. In certain preferred embodiments, the rate of change of the rise time of the first capacitor is essentially the same as the rate of change of the fall time of the second capacitor; and the rate of change of the fall time of the first capacitor is essentially the same as the rate of change of the rise time of the second capacitor. The overall variation in slew rates of the signals is dependent on the ratios of the adjusted currents and the capacitance seen by the current source. To accommodate a wide frequency range, the reference current utilized may be proportional to frequency via a switched capacitance bias current generator.

In some embodiments, the methods and apparatuses of the present invention are employed in memory systems and are used to correct, adjust or control the duty cycle of one or more of the memory system's clock signal. Because clock duty cycles may become distorted as they are buffered and distributed throughout a chip or among different chips, the methods and apparatuses described herein may be incorporated in or on memory devices and/or memory controllers. Because DDR memory systems frequently require precise duty cycle control, the methods and apparatuses of the present invention may be particularly useful in or on DDR memory devices and/or DDR memory controllers. In view of the wide variety of embodiments that will be described hereinafter, it should be understood that the present invention is not limited to memory systems, and the methods and devices described hereinafter could be equally applicable in any other system that may have a need for duty cycle correction, adaptation, or control. Devices that may employ the methods and/or apparatuses of the present invention, include, for example, memory devices, memory controllers, microprocessors, digital signal processors, micro-controllers, any digital logic circuitry, hybrid logic circuits (for example, analog-to-digital and digital-to-analog converters, motor controllers, etc.), etc. Systems that may usefully employ the methods and/or apparatuses of the present invention, include, for example, memory systems, computer systems, data systems, telecommunication systems, automated manufacturing systems, process control systems, test systems, etc.

With reference to FIG. 1A, a preferred embodiment of the duty cycle adjuster 10, or duty cycle correction circuit, will be described. The duty cycle correction circuit 10 includes a clock generator 12 having a duty cycle shaping circuit 14 and a clock waveform circuit 16. The clock generator 12 provides a clock signal 18 to the electronic system. Clock generation circuit 12 has an input labeled $CLOCK_{REF}$ signal 20, which is typically a clock reference signal. It may be generated from a voltage-controlled oscillator, but could be derived in any suitable manner, including a timing recovery circuit, a frequency divider circuit, or the like.

The clock signal 18 is provided to the duty cycle corrector circuit 22. The duty cycle corrector circuit 22 includes a duty cycle detector 24 and an error accumulator 25. The duty cycle detector generates an incremental error signal that is passed to the error accumulator 25. The error accumulator is configured to generate a duty cycle correction signal and provide it to the duty cycle shaping circuit 14 over line 28. The duty cycle correction signal represents an accumulated error measurement. In certain embodiments, the duty cycle correction signal may be generated in part in response to the incremental error measurements, and in other embodiments it may be generated in response to other inputs as described herein.

The duty cycle correction signal from the error accumulator may be an analog voltage or analog current that is used to shape the $CLOCK_{VCO}$ waveform. Alternatively, the duty cycle correction signal may be in digital format (e.g., binary). Line 28 may be a parallel signal bus comprising a plurality of conductors to accommodate parallel binary signals.

Figure 1B:
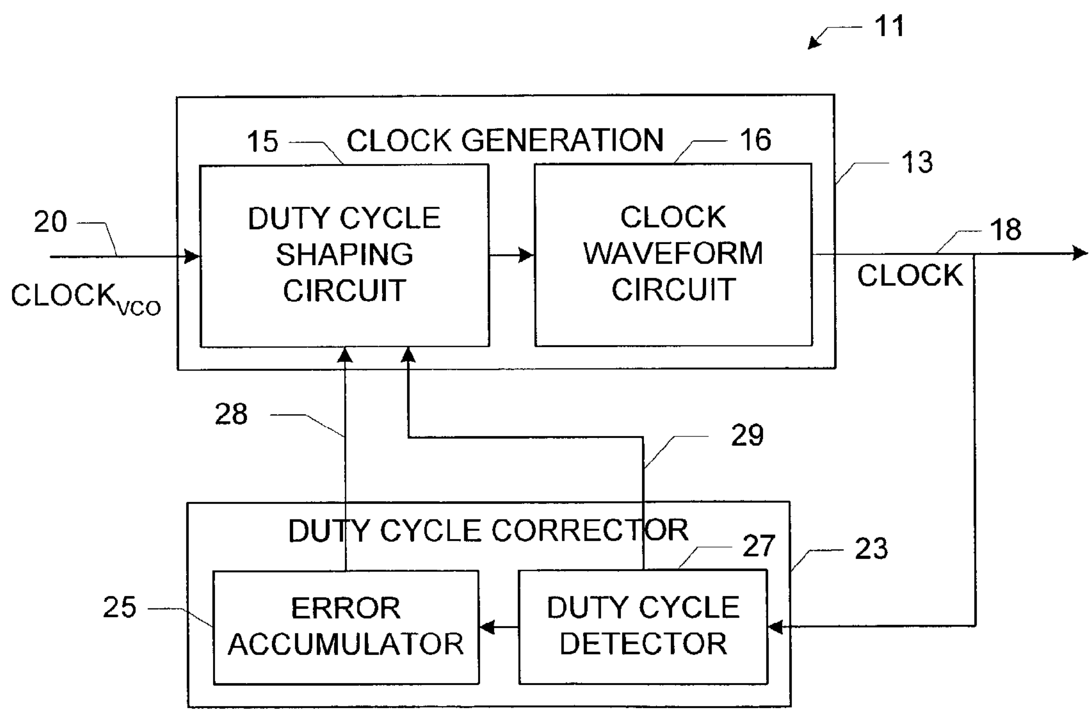

In the embodiment of FIG. 1B, the duty cycle correction circuit 11 includes a clock generator 13 and a duty cycle corrector 23. As with the embodiment of FIG. 1A, the duty cycle detector 27 generates an incremental error signal that is passed to the error accumulator 25, which generates a duty cycle correction signal over line 28. However, the duty cycle detector 27 also provides a duty cycle correction signal on line 29 to the duty cycle shaping circuit 15. Preferably, the duty cycle correction signal on line 29 comprises a fine duty cycle correction signal. The fine duty cycle correction signal is preferably an analog signal. The correction signals of FIG. 1B may be provided such that the duty cycle correction signal on line 28 provides a coarse duty cycle adjustment signal and the fine duty cycle correction signal on line 29 provides a fine duty cycle adjustment signal.

Figure 2:
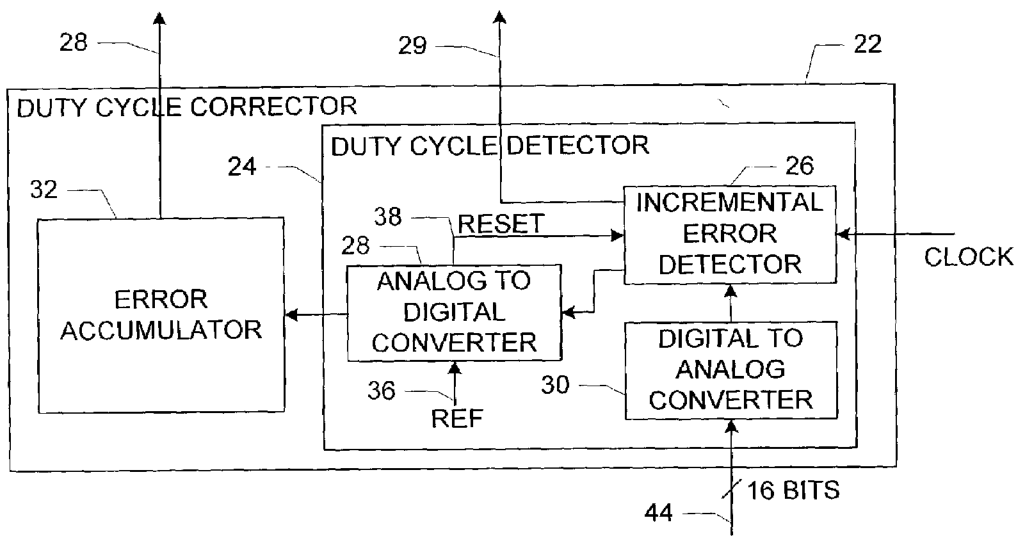
FIG. 2 is a preferred embodiment of a duty cycle corrector.

As shown in FIG. 2, one embodiment of the duty cycle detector 24 includes an incremental error detector 26, an analog to digital converter (ADC) 28 and a digital to analog converter (DAC) 30. The clock signal 18 is input to the incremental error detector 26, which generates an analog voltage in the presence of a duty cycle error in clock signal 18. This analog voltage, which is also referred to as the incremental duty cycle error voltage, is converted to a digital signal by ADC 28, and is provided to the error accumulator 32. In one embodiment the ADC 28 may be a comparator or a comparator circuit utilizing a reference voltage 36. In alternative embodiments, one of which is shown in FIG. 3, the ADC 28 may be an ADC 42 that generates a quantized value representative of the analog voltage from the incremental error detector 26.

In the embodiment of FIG. 2, the ADC 28 generates a reset signal 38 to reset the incremental error detector 26. In an alternative embodiment shown in FIG. 3, the error accumulator 40 generates the reset signal 38. The embodiments shown in FIGS. 2 and 3 depict a DAC 30 having a digital input 44. It should be understood that the DAC 30 is an element present in embodiments where the duty cycle corrector 22 is programmable, and is otherwise not necessary.

Figure 3:
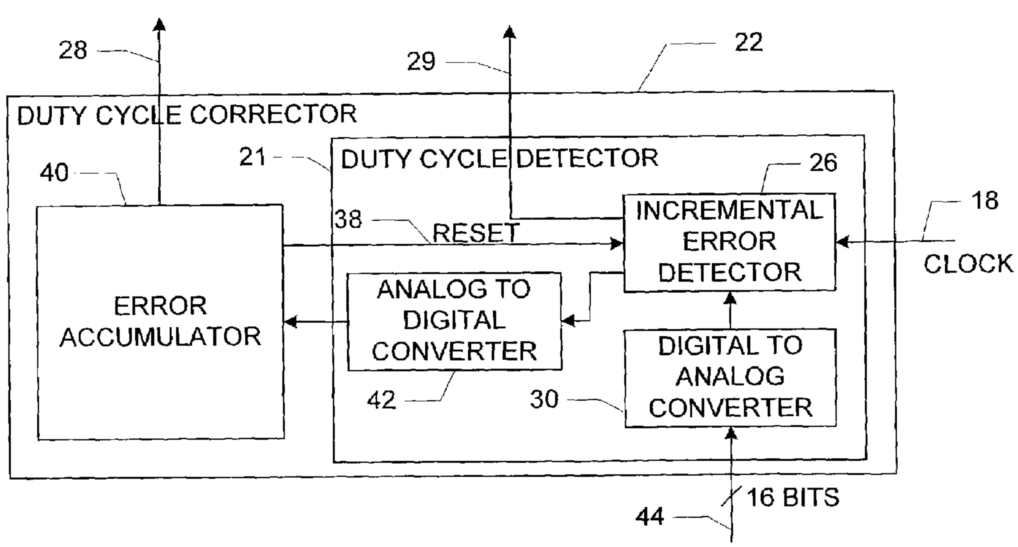
FIG. 3 is an alternate preferred embodiment of a duty cycle corrector.

Furthermore, both FIGS. 2 and 3 depict incremental error detectors 26 providing an output 29, which is a fine duty cycle adjustment signal. As previously mentioned, the fine adjustment signal may be omitted in certain embodiments where the accumulated error signal on line 28 provides sufficient control. Specifically, error accumulator 32, 40, may be configured with varying degrees of sensitivity. As such, in certain embodiments, the accumulated error output on line 28 may be sufficient by itself to obtain the desired duty cycle correction or adjustment within sufficient error tolerances. In other embodiments, the accumulated duty cycle correction may be supplemented with a fine adjustment signal from the incremental error detector on line 29, as shown in FIGS. 2 and 3. In such embodiments, the accumulated error signal on line 28 may be used as a coarse duty cycle adjustment signal.

One embodiment of duty cycle shaping circuit 14 will be described with respect to FIG. 4A. The differential amplifier made up of FETs 50 and 52 are switched by $CLOCK_{REF}$ on terminal 54 and $CLOCK'_{REF}$ (the inverse of $CLOCK_{REF}$) on terminal 56, respectively. Current source 68 and current supply circuit 66, containing current source 62 and current source 64, and current source 68, provide current for the differential amplifier. Current sources 62, 64 and 68 preferably have a current I. The differential output generated by the switching FETs 50 and 52 appears across nodes 70 and 72, and is applied to operational amplifier 74. The operational amplifier 74 is optional, and is included to provide a single ended CMOS clock signal CLOCK on node 80. Similarly, inverter 78 is optional, and provides the inverse clock signal CLOCK' on node 79.

Capacitors 58 and 60 are provided to delay the rising edge and falling edge of the signals on nodes 70 and 72, respectively. As shown in FIG. 4B, waveform W1 corresponds to the signal on node 70. The voltage signal on node 70 increases when FET 50 is off and current from current source 62 charges capacitor 58. The smaller the value of capacitor 58, the more rapidly the voltage will rise on node 70. When FET 50 turns on, the voltage of node 70 is drawn low as capacitor 58 discharges. FET 50 and FET 52 have opposite phases, and hence the voltage at node 72 appears as shown by waveform W2 in FIG. 4B. The clock signal generated by waveforms W1 and W2 is depicted in FIG. 4C as waveform SW1. Because W1 and W2 are inputs to comparator 74, the clock transitions of SW1 occur where W1 and W2 cross.

DAC 76 in FIG. 4A is used to adjust the rates of charge and discharge of the capacitors 58 and 60 to thereby adjust the duty cycle. As discussed below, the DAC 76 may steer current away from (or to) capacitors 58 and 60, or may adjust the capacitance by selectively enabling or disabling additional capacitors. Other DAC embodiments may also be used.

Thus, a modified waveform W3 shown in FIG. 4B may be generated by steering current away from node 70 or by increasing the capacitance at node 70. Either of these embodiments slows the charging and speeds the discharging of capacitor 58, as shown by waveform W3. Comparator 74 operating on inputs W3 and W2 will generate a clock signal as depicted by waveform SW2 in FIG. 4C. As can be seen in FIG. 4C, the duty cycle of SW2 is less than that of SW1. In an alternative embodiment, DAC 76 may be used to simultaneously affect the charging and discharging of capacitor 60, to affect W2 in a similar manner (not shown). By controlling the duty cycle shaping circuit with a DAC, the duty cycle of a clock signal may be controllably adjusted.

Figure 4D:
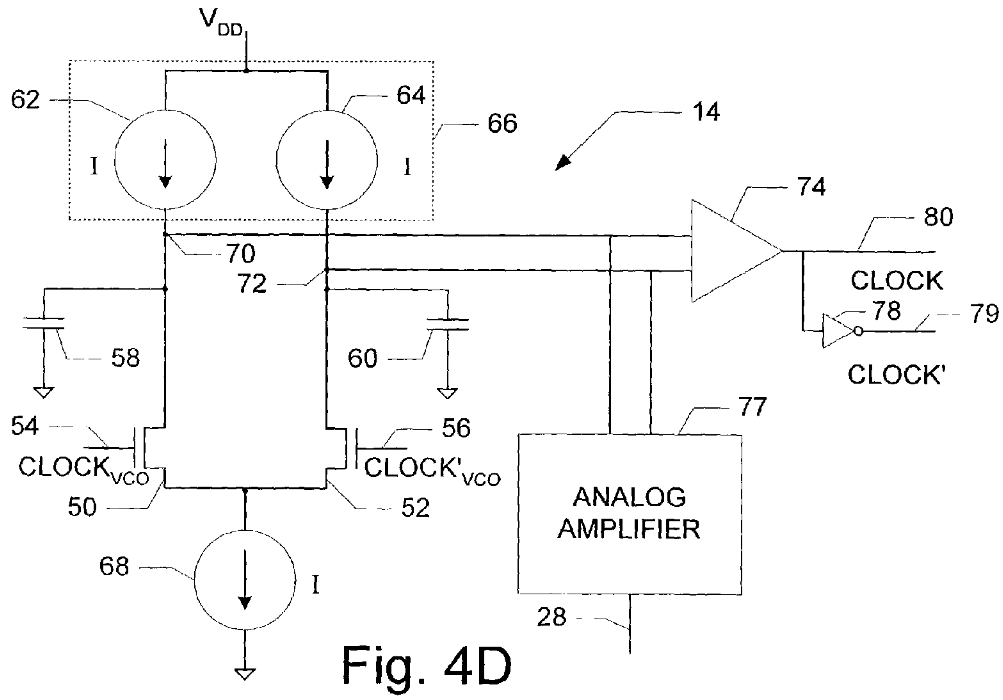
FIGS. 4D and 4E are alternative preferred embodiments of duty cycle shaping circuits.

In FIG. 4D, a further embodiment of duty cycle shaping circuits 14, 15, is depicted including an analog amplifier 77. Analog amplifier 77 is preferably in the form of a differential amplifier such as a differential transistor pair, which is used to steer current from nodes 70 and/or 72. However, other standard analog amplifier circuits may be used to steer current from (or to) one or both of nodes 70 and 72. In this embodiment the error accumulator 25 preferably provides a duty cycle correction signal comprising a differential analog voltage to the analog amplifier 77 over line 28, which in this embodiment comprises two conductors to carry the differential voltage. The analog voltage is preferably used to control the conduction of transistor elements that steer current away from nodes 70 and/or 72.

Figure 4E:
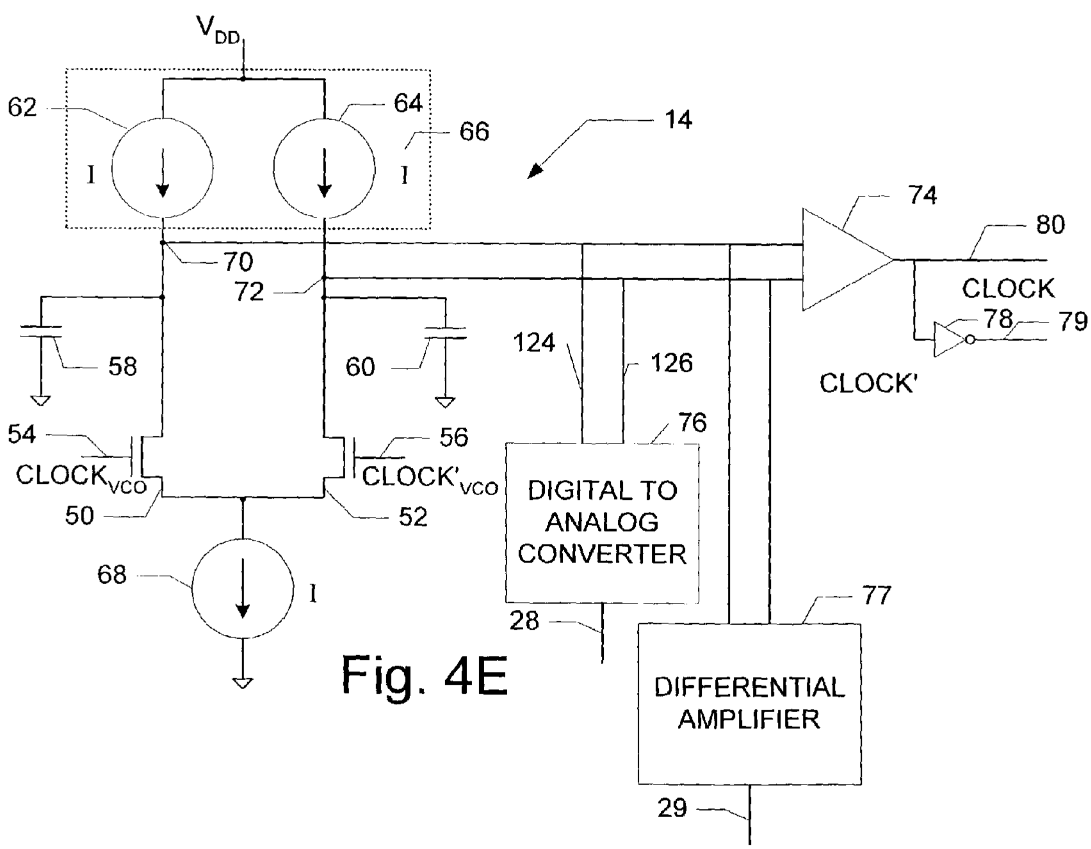

FIG. 4E depicts a further alternative embodiment generally corresponding to the circuit topology of FIG. 1B, wherein the duty cycle corrector provides duty cycle correction signals on lines 28 and 29 to the duty cycle shaping circuit 15. Preferably, the duty cycle correction signal on line 29 comprises a fine duty cycle correction signal, while the duty cycle correction signal on line 28 provides a coarse duty cycle correction signal.

The coarse duty cycle correction signal may be a digital signal provided to a DAC 76 as depicted in FIG. 4E, or it may be an analog voltage provided to another differential amplifier (not shown) in the place of DAC 76 of FIG. 4E. Similarly, the fine duty cycle correction signal may be in the form of an analog signal (preferably a differential voltage over a two-conductor signal path) as shown in FIG. 4E, or may be a digital signal provided to a DAC (not shown) in the place of differential amplifier 77. In the case where both the coarse and the fine duty cycle adjustment signals are in digital form, they may be combined to provide an input to a single DAC with current sources having different values, such that the least significant bit or bits are provided by the fine duty cycle adjustment signal and the most significant bit or bits are provided by the coarse duty cycle adjustment signal.

Figure 5A:
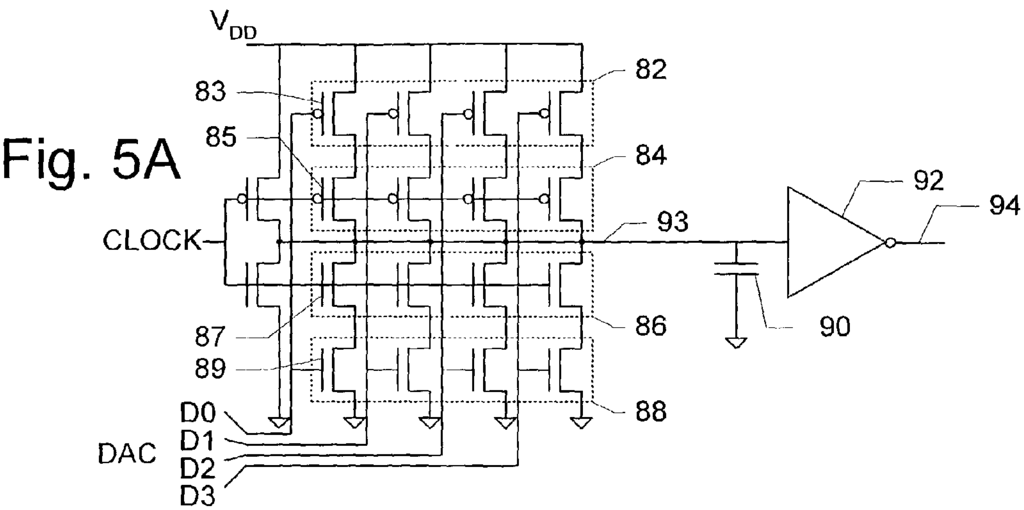
FIG. 5A is an alternative preferred embodiment of a duty cycle shaping circuit.

A further alternative duty cycle shaping circuit is shown in FIG. 5A. The DAC comprises FET devices in blocks 82, 84, 86, and 88. The FET devices shown in block 84 and block 86 are alternately turned on and off by the CLOCK signal. The FET devices in blocks 82 and 88 are controlled by the digital DAC input signals D0–D3. Specifically, each of the FETs in blocks 82 and 88 will work in a complementary fashion to enable only one of the corresponding series connected FETs in block 84 or block 86. For example, depending on the DAC signal on line D0, only one of FETs 83 and 89 will be turned on (for example, FET 89 is on if D0 is a logic 1, FET 83 is on if D0 is a logic 0). Whichever FET (FET 83 or FET 89) is turned on, the corresponding series connected FET (FET 85 or FET 87) will be connected between node 93 and a supply voltage (VDD or ground, respectively) in response to the CLOCK signal. Thus, each column of FETs (e.g., one column comprising FETs 83, 85, 87, 89) either provides a current path from VDD to node 93 or a current path from node 93 in response to the CLOCK signal.

In this manner, the DAC inputs D0–D3 control the current paths that are used to charge and discharge capacitor 90, which in turn affect the voltage waveforms at node 93. Inverter 92 provides the final signal shaping to derive a final clock signal on node 94.

Figure 5B:
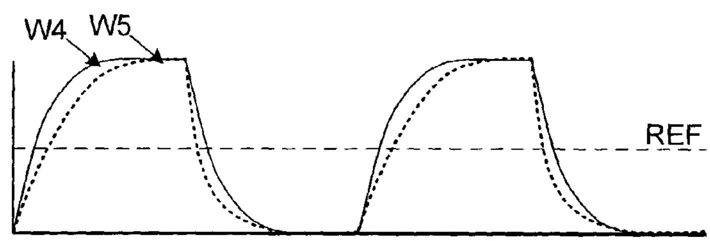
FIGS. 5B and 5C depict waveforms associated with the duty cycle shaping circuit of FIG. 5A.
Figure 5C:
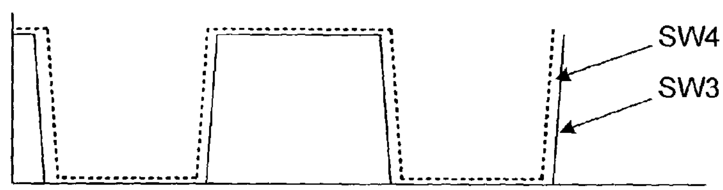

The waveforms are shown in FIGS. 5B and 5C. Waveform W4 might correspond to a DAC value of 0011. A value of 0011 provides two additional charging paths and two additional discharging paths for capacitor 90. If the DAC value is changed to 0111, only one additional charging path is provided, while three discharge paths are provided. The resulting waveform will resemble W5 in FIG. 5B. Thus, the times at which the waveforms cross the REF voltage (the internal reference threshold of inverter 92) is varied, resulting in the waveforms SW3 and SW4 having different duty cycles.

Thus, the DAC provides a mechanism to alter the voltage characteristics at node 93 to accomplish duty cycle corrections or modifications. By diverting current flow from capacitor 90, the rate of charging may be further delayed, and the rate of discharge may be increased. Of course alternate circuit arrangements may be used to provide a clock signal. For example, selectively adding capacitance to node 93 affects the rate of change of voltage across capacitor 90.

Figure 5D:
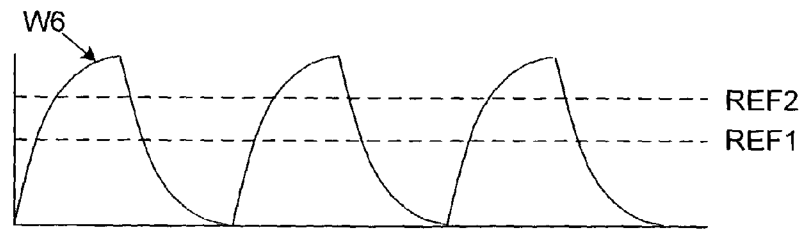
FIGS. 5D and 5E depict waveforms associated with an alternative duty cycle shaping circuit.
Figure 5E:
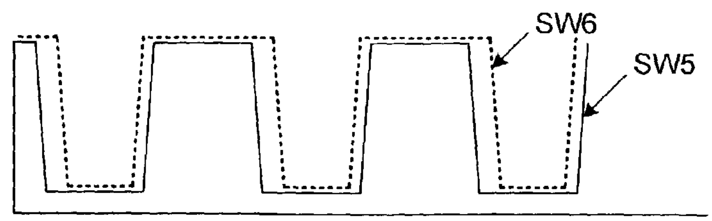

As one of ordinary skill in the art will recognize, there are numerous alternative circuit arrangements that may be used in the duty cycle shaping circuits 14, 15, to alter the waveform characteristics based on an input signal from an error accumulator, thereby resulting in a change in the duty cycle. One such further alternative is to use a comparator in place of inverter 92 and a DAC (not shown) to alter the reference voltage of the comparator. Any asymmetries in the charging and discharging of capacitor 90, (with or without a programmable current or capacitive element), may be used in conjunction with the comparator to modify the duty cycle. As shown in FIGS. 5D and 5E, square wave SW5 is generated by a comparator having a reference voltage REF1, and square wave SW6 is generated when the reference voltage is REF2. It should be understood that the embodiments described herein are for illustrative purposes, and any suitable circuit topology that accepts an accumulated control input to responsively adjust the duty cycle may be utilized.

With respect to FIG. 6, DAC 120 will be described. DAC 120 may be used as DAC 30, DAC 76, DAC 176 and/or DAC 180 in the circuits of FIGS. 2, 3, 4, 9 and 10. Of course it is understood that the component values will differ depending on whether the DAC is used in the duty cycle corrector 22 as opposed to the clock generator 12. For example, the incremental error detector circuit 26 may perform an integrator function to develop the incremental error voltage, thus requiring a relatively high capacitance to current ratio, while the clock generator is shaping the clock waveform, requiring a lower capacitance to current ratio to allow the capacitors to more fully charge and discharge in a single duty cycle.

Figure 6:
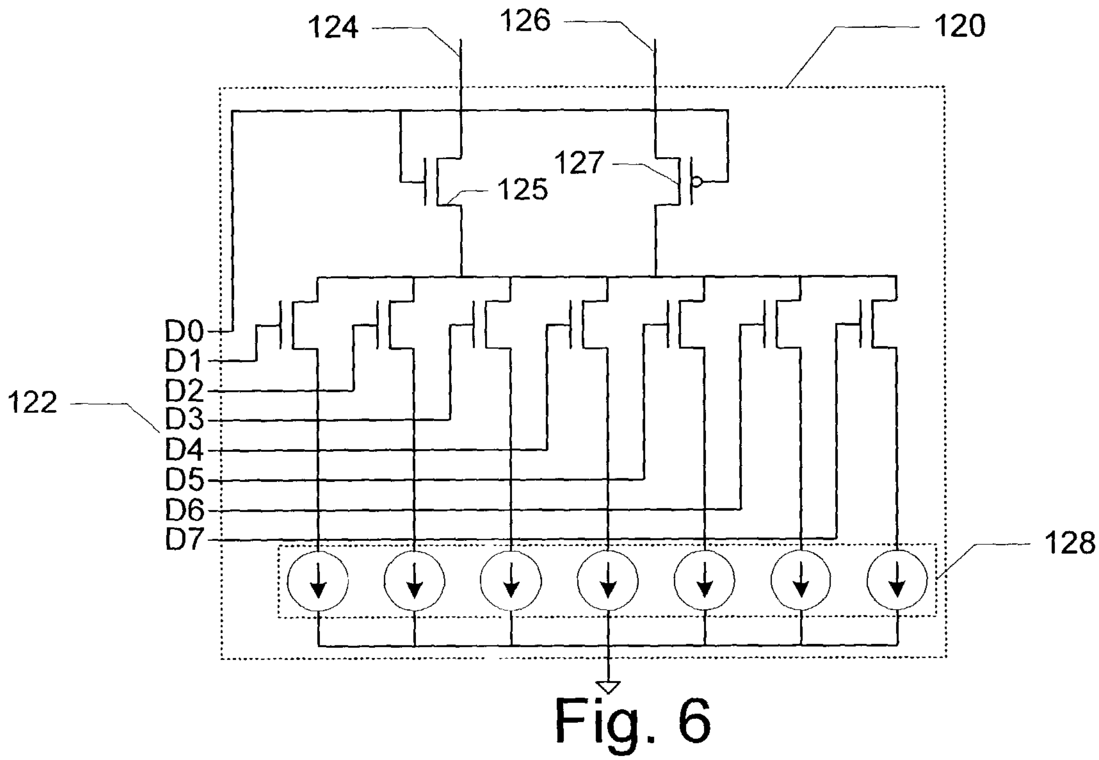
FIG. 6 is a preferred embodiment of a digital to analog converter for use in the duty cycle shaping circuit of FIGS. 4A and 4E or the duty cycle corrector of FIGS. 2 and 3.
Figure 9:
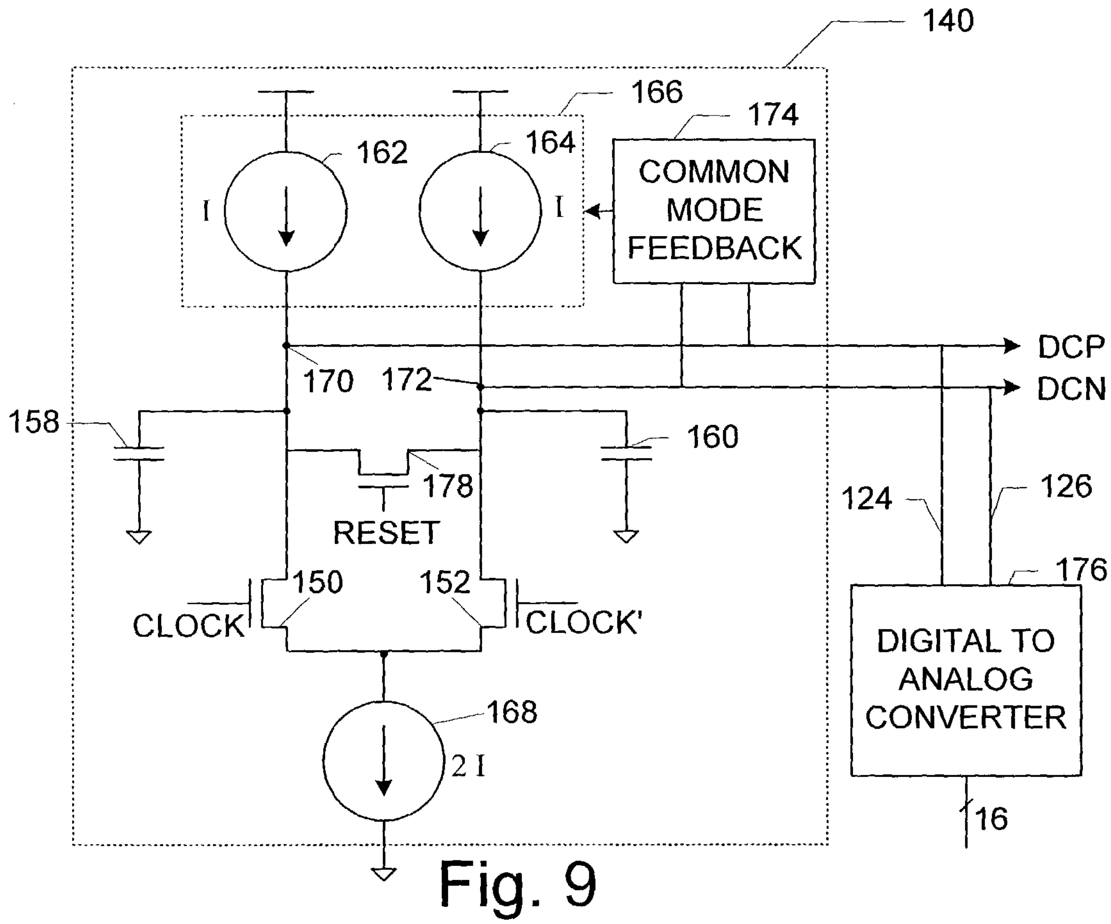
FIG. 9 is a preferred embodiment of an incremental error detector.

Digital input D0-D7 122 controls the FET devices shown in FIG. 6. Inputs D1 through D7 control the overall amount of current flow, while D0 determines whether the current sources are attached to node 124 or node 126 by controlling FETs 125 and 127. As seen in FIGS. 4 and 9, the DAC 76 and DAC 176, respectively, are connected in a differential manner, requiring two output nodes 124 and 126. For example, node 124 connects to node 70 in FIG. 3, while node 126 connects to node 72 in FIG. 3. In preferred embodiments, the number of digital inputs corresponds to the number of elements to control with the DACs. The embodiment shown in FIG. 6 utilizes only an 8-bit input, but the DAC could also be configured with more, or fewer, transistor elements to control. By connecting the current sources to the node 70, the charging of capacitor 58 is slowed when FET 50 is non-conducting, while the discharging of capacitor 58 is increased when FET 50 is conducting. Alternatively, by connecting the current sources to the node 72, the charging of capacitor 60 is slowed when FET 52 is non-conducting, while the discharging of capacitor 60 is increased when FET 52 is conducting.

In an alternative embodiment, the circuit of FIG. 6 may be modified to provide a differential current steering topology having, e.g., eight current source/FET pairs on each node 124, 126 (omitting FETs 125, 127), such that differential currents may be applied to each node (e.g., 70, 72, or 170, 172), and thereby having equal but opposite effects on the nodes. That is, by introducing unequal currents in the nodes, the charging rate of node 70 may be increased and the discharging rate decreased, while the charging rate of node 72 may be decreased and the discharging rate increased, and vice-versa. In this manner, a symmetrical effect may be induced on the nodes under control. The differential current steering circuit embodiment is preferably designed to impose an equal current in each node when no adjustment is necessary, and to impose an equal but opposite offset in each current to effect an adjustment.

Figure 7:
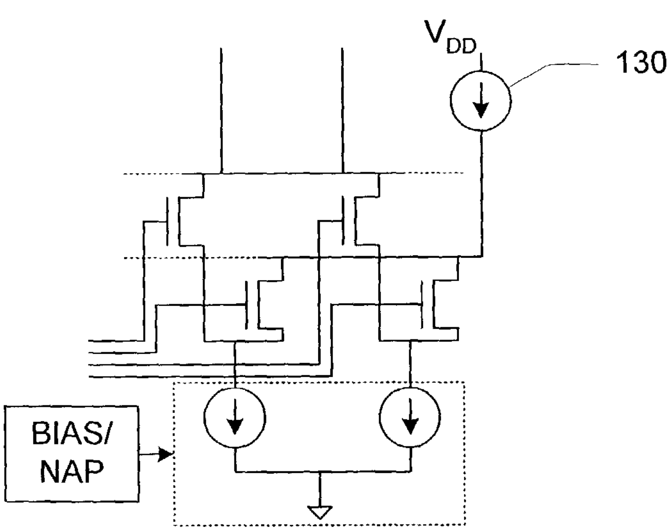
FIG. 7 is a portion of an alternative preferred embodiment of the digital to analog converter of FIG. 6.

In an alternative embodiment, the FETs in FIG. 6 (with the exception of FETs 125 and 127) may each be replaced by a pair of FETs as shown in FIG. 7 (Note that FIG. 7 shows four transistors that would replace two FETs in FIG. 6). Each current source within current source circuit 128 either draws current from the duty cycle shaping circuit 14 (or the charge pump circuit 140 of FIG. 9) or from the current source 130. This enables a bias current to be provided to the current sources within current source circuit 128 when they are disconnected from the nodes (e.g., nodes 70, 72, or 170, 172). The control signal for this embodiment would include complimentary logic signals for each FET pair, resulting in a sixteen-bit control signal for a circuit having a topology similar to FIG. 6 (where FETs 125 and 127 are controlled by a pair of complementary control signals). Alternatively, an embodiment of the DAC utilizing the FET pair arrangement of FIG. 7 together with a differential current steering topology would require thirty-two bits (eight FET pairs attached to each node). Again, the number of elements may be varied depending on the degree of programmability required.

Figure 8:
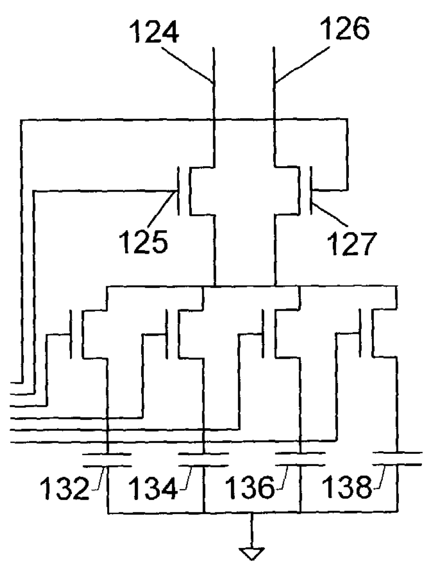
FIG. 8 is an alternative preferred embodiment of the digital to analog converter of FIG. 6.

FIG. 8 shows yet a further embodiment of a DAC for use in the clock generator or the duty cycle detector 21, 24, 27. One or more capacitors 132, 134, 136, 138, may be selectively inserted into the clock generator or the duty cycle detector by activating the corresponding series-connected FET device. As discussed above, the DAC may also be modified to provide any number of capacitor/FET pairs. The DAC may also be modified to provide differential inputs on both nodes simultaneously, as opposed to being connected to only one node or the other via FETs 125 and 127. Thus, the DAC is preferably configured such that each of the capacitors may be independently and selectively enabled.

Further embodiments of the DAC circuits discussed above include having current sources with differing values within current source circuit 128. This allows a greater range of currents to be programmed and provided by the DAC. For example, if four current sources were used, having values of I, 2I, 4I and 8I, any current having an integer value from zero to 16I (0, 1I, 2I, . . . , 16I) may be provided. Similarly, the capacitive values of the circuit depicted in FIG. 8 may differ, thereby providing a greater range of capacitances in a like manner.

The incremental error detector 26 may be implemented as a differential charge pump 140 as shown in FIG. 9. The FETs 150 and 152 charge and discharge the integrating capacitors 158 and 160, and common mode feedback circuit 174 eliminates common mode noise, in accordance with well-known properties of charge pump circuits. That is, current sources 162 and 164 of current supply circuit 166 provide a current to the FETs 150 and 152. When FET 150 is not conducting, the current from source 162 (having current I amperes) flows into capacitor 158 resulting in an increase in the voltage at node 170. When FET 150 is conducting, the current from source 162 flows through the FET 150 to source 168, and in addition, because source 168 is 2I, it draws a current I from capacitor 158, resulting in a decrease in the voltage at node 170. The charging and discharging of capacitor 160 occurs in a similar manner, but in response to the CLOCK' signal.

Thus, if (i) the capacitors 158 and 160 are equal valued, (ii) the duty cycle is 50%, and (iii) the DAC 176 is inactive, then the voltages on nodes 170 and 172 will remain relatively constant—at an equilibrium. In the presence of a duty cycle error, a differential voltage will develop because one capacitor gradually increases its charge each cycle (due to more current going into the capacitor than is removed as a result of the FET being off longer than it is on), while the other capacitor gradually discharges (more current is removed than is provided during each cycle). The differential voltage will continue increasing until the offset is corrected, at which point the differential voltage will stabilize. The differential voltage is thus an incremental duty cycle error indication.

In the circuit of FIG. 9, DAC 176 is used to adjust the equilibrium point. By changing the current available to charge and discharge the capacitors, the duty cycle that will keep the voltage constant is changed. For example, if the DAC 176 draws a current from node 170, then there will be less current available to charge capacitor 158 resulting in a lower charge rate. During the discharge portion of the cycle, more current will be drawn from capacitor 158 resulting in a faster discharge rate. The voltage will continually decrease until the duty cycle is decreased to an equilibrium point.

In an alternative embodiment, the DAC 176 may be incorporated into the current source 166. That is, by making the current sources 162 and 164 programmable, the same current steering affect may be achieved. Specifically, if current source 162 is programmed to deliver incrementally less current, and current source 164 is programmed to deliver incrementally more current, then only a CLOCK signal having a proportionally lower duty cycle will stabilize the voltage at nodes 170 and 172. If the current sources are programmed in an opposite manner, a higher duty cycle will result.

Figure 11:
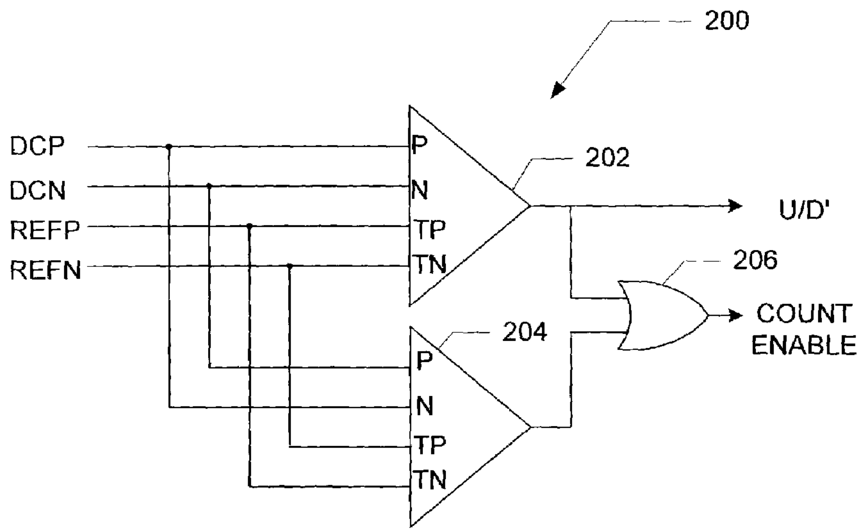
FIG. 11 is a preferred embodiment of an analog to digital converter.

As discussed previously, the charge pump is used to generate an incremental error measurement. The incremental error measurement is preferably a digital signal that is then accumulated by the error accumulator 32. In the duty cycle corrector of FIG. 2, the ADC 28 may be implemented as a digitizer 200 as shown in FIG. 11. The digitizer 200 includes a first comparator 202 and second comparator 204 and compares the differential voltage on nodes 170 and 172 to a positive differential reference (REFP-REFN in comparator 202) and a negative differential reference (REFN-REFP in comparator 204). If the differential voltage DCP- DCN exceeds the positive threshold in comparator 202 or if the differential voltage DCN-DCP exceeds negative threshold in comparator 204, a COUNT ENABLE signal is generated by OR gate 206, and the up/down signal ("U/D") from comparator 202 indicates whether the error was positive or negative, respectively, thereby requiring a corresponding duty cycle increase or decrease, respectively. In this way, the differential voltage serves as an incremental duty cycle error voltage.

The comparators may be configured to sample the error voltage continuously or periodically, perhaps as frequently as every clock cycle. In the embodiment of FIG. 9, it is advantageous to sample nodes 170 and 172 at similar points in their charging and discharging cycles. That is, FET 150 begins conducting, thereby beginning a discharge cycle of capacitor 158, when the CLOCK signal transitions to a high level. On the other hand, FET 152 begins conducting and discharging capacitor 160 on the CLOCK' signal's transition to a high level. Thus, the comparator sampling is preferably performed on the CLOCK and CLOCK' signals for the DCP and DCN signals, respectively.

In addition, the differential voltage across the charge pump is eliminated by resetting the charge pump with the RESET signal applied to FET 178, thereby equalizing DCP and DCN and minimizing the voltage difference. In this manner, the duty cycle correction signal from the error accumulator circuit 32 continues to increase (or decrease) in response to repeated incremental error signals, thereby adjusting the duty cycle, until the charge pump 140 remains at or near equilibrium, having substantially zero differential voltage, such that the differential incremental duty cycle error voltage remains between both predetermined thresholds.

Practically, however, some duty cycle error may still exist and the differential voltage may gradually increase, eventually causing the generation of an incremental error signal. A corresponding change in the duty cycle correction signal from the accumulator circuit may result in overcompensation, eventually resulting in the generation of a further incremental error signal, but in the opposite direction. Thus, incremental error signals in alternating directions (an "UP" signal followed by a "DOWN" signal, followed by another "UP" signal) may be used as an indication of duty cycle lock.

In alternative embodiments of incremental error detector 26, the differential voltages DCP and DCN from nodes 170 and 172 may be used to supplement the duty cycle correction signal. Specifically, the charge pump may continue to generate incremental error signals for accumulation, but in addition may provide an analog signal in the form of a differential voltage (DCP-DCN) to control an analog amplifier 77 as described with reference to FIG. 4E. In this manner, the accumulated error signal on line 28 may be configured to provide a step-wise signal (in accordance with a binary signal or an analog signal having discrete steps or increments) to provide a coarse duty cycle adjustment, while the differential voltage from the charge pump 140 may be used to provide a fine duty cycle adjustment to control a differential amplifier such as analog amplifier 77.

In a further embodiment, the fine duty cycle adjustment signal may be digitized and may be used to control an additional DAC, or may be used to control the least significant bit or bits of the input to DAC 76 of FIG. 4A, as previously described.

In the various embodiments described herein, it can be seen that by providing an accumulated duty cycle correction signal allows the charge pump 140 to be used to generate incremental error signals, and to operate at a reduced differential voltage. In addition, the threshold values that are used to generate the incremental error signals may be made arbitrarily small, typically only restricted by the noise levels inherent in the circuit. As a result, the duty cycle corrector 22 has increased sensitivity and increased dynamic range because of the reduced constraints on the duty cycle detector 21, 24. Still further, embodiments providing both a coarse duty cycle correction signal and a fine duty cycle correction signal provide design flexibility and the ability to further increase the sensitivity of the duty cycle corrector 22.

Figure 10:
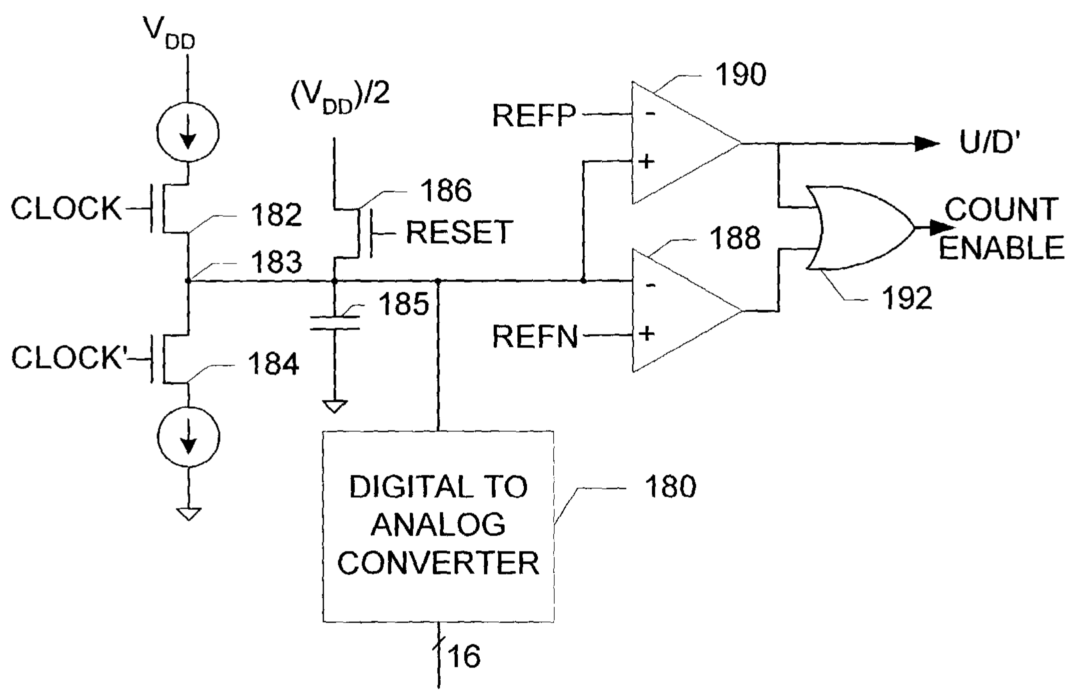
FIG. 10 is an alternative preferred embodiment of an incremental error detector.

In a further alternative embodiment, the charge pump 140 may be implemented as a single-ended charge pump as depicted in FIG. 10. FETs 182 and 184 allow capacitor 185 to be charged and discharged, respectively. The duty cycle of the clock signal CLOCK will determine charge and discharge currents of capacitor 185, and hence its voltage value may be used as an indicator of duty cycle error. If FETs 182 and 184 are the same size, and DAC 180 is inactive, the duty cycle error voltage on capacitor 185 will remain constant if the duty cycle is 50%. DAC 180 allows other duty cycles to result in a stable voltage on node 183 by providing additional charging or discharging current paths.

FET 186 is provided to reset the voltage on node 183 after the error threshold has been exceeded. The reset FET 186 may, for example, set the node 183 to $V_{DD}/2$.

The ADC function is provided by comparators 188 and 190. If the voltage across capacitor 185 goes above a positive threshold REFP or below a negative threshold REFN, the comparators 190 and 188, respectively, will provide a logic 1 output and via OR gate 192, provide a COUNT ENABLE signal. The output of one of the comparators is also used to provide an indication of the direction of the error (an "up" count U, or "down" count D). As discussed above, alternative ADCs may be used, such as an ADC providing a quantized value representative of the analog voltage on node 183.

In an alternative embodiment, DAC 180 takes the form of parallel-connected FET devices that can alter the current flow to and/or from node 183 in a manner similar to the FET arrangement depicted in FIG. 5A. That is, FET devices connected in parallel with FET 182 and/or FET 184 may be enabled or disabled by additional FET devices that are switched on and off in response to a digital input signal to control the charging and discharging of capacitor 185. By controlling the current paths that are available to charge or discharge the capacitor 185, the duty cycle that will cause the voltage at node 183 to remain constant is changed.

In the embodiment of FIG. 2, the error accumulator 32 may simply count the number of up and/or down pulses to create a counter value. The counter value may then be provided as a digital duty cycle correction signal to the duty cycle shaping circuit 14. Alternatively, the incremental error signal may be filtered as part of generating the duty cycle correction signal. One advantage of filtering the incremental error signal is that it will reduce duty cycle jitter. Any number of filtering algorithms may be used, including linear or non-linear filtering and time-variant filtering.

Figure 12:
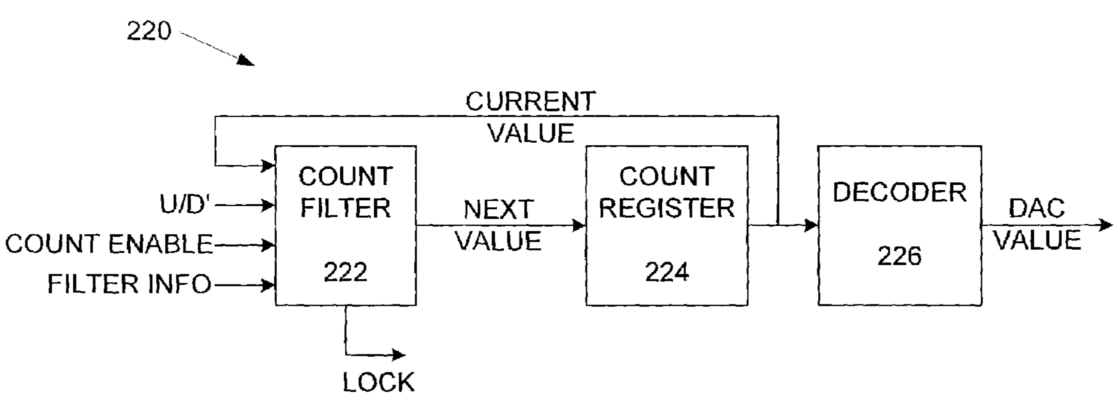
FIG. 12 is a preferred embodiment of an error accumulator.

In one embodiment shown in FIG. 12, the error accumulator 32 is implemented as a count filter 222, a count register 224, and a decoder 226. The count filter 222 preferably receives inputs including a count enable signal (COUNT ENABLE) indicating the occurrence of an incremental error voltage passing a threshold voltage to generate an incremental error signal, an up/down count signal (U/D') indicating whether the error was positive or negative, and other filter info. The FILTER INFO input may include numerous signals providing status information, such as signals indicating that a fast lock or binary search algorithm should be implemented, or signals conveying status or state information about the device in which the duty cycle corrector is being utilized (nap or low power state, wake up state, etc.). The count filter 222 also preferably has the current value (CURRENT VALUE) as an input. This may be provided as an input, or it may be stored in a buffer within the count filter 222.

The count filter 222 provides as an output the next value to be loaded into the count register 224. This value represents the accumulated error signal. A decoder 226 is then provided to perform any necessary translation of the digital counter value to an appropriate control signal for the DAC. Specifically, the DAC input may require specific signals to control FETs such as FET 125 and FET 127. Thus, depending on the particular DAC embodiment being used, and the particular implementation of the count filter 222, a decoder 226 may be preferred, or may not be required.

In one preferred embodiment, the count filter 222 increments the counter value stored in the count register 224 by eight in response to the filter info signal so as to provide rapid adjustment of the accumulated error signal. The counter increment may be adjustable to accommodate various step sizes and correspondingly modify the rate of lock convergence. Specifically, the rate of convergence refers to the speed at which the optimal duty cycle correction signal is generated. In the case of a large duty cycle error, the rate convergence may be increased by increasing the step size, thus causing a larger change in the accumulated error signal due to a single occurrence of an incremental error signal. Thus, the counter step size may be selected from a plurality of step sizes, depending on whether the counter is in a fast lock mode, or if the incremental error signals are generated rapidly, etc. That is, the rapid adjustment may be enabled for an initial lock period following power on or following an idle or "nap" mode, or it may be done in response to the speed at which the incremental error signal is generated after a reset operation, or the change in speed at which the incremental error signal is generated. In the embodiment shown, count filter 222 can load any value into the counter register 224. This may facilitate rapid recovery from an idle or "nap" mode. In addition, the nap recovery value of the digital duty cycle correction signal to be loaded into the count register 224 may be a value calculated from the value obtained during a previous locked state. The calculation may involve an adjustment to compensate for a temperature decrease that would be expected (or one that is measured) during an idle period.

In a further embodiment the error accumulator circuit includes a state machine, preferably implemented as a sequential logic circuit. However, a software based state machine could also be used. The state machine may be programmed to implement a variety of duty cycle correction algorithms, and could include states associated with naps or idle, lock, rapid relock, etc. The state machine may implement a state-based filtering operation using a register or series of registers acting as a ROM table to provide lookup values for the desired digital duty cycle correction signals corresponding to the various states or algorithms. A typical algorithm that may be desirable is a binary search algorithm to provide a quick lock, or an adjustable counter increment, or a temperature adjustment, or nap recovery, as discussed herein.

In an alternative embodiment, the ADC 42 of FIG. 3 may be configured to generate a multiple bit signal representing a quantization value corresponding to the output of the incremental error detector 26, or when detector 26 is implemented as a charge pump (as depicted for example in FIG. 9) corresponding to the voltage of the charge pump 140. The error accumulator 40 examines the ADC value to determine if it exceeds a digital threshold. If so, the error accumulator 40 generates a reset signal and processes the incremental error accordingly. The particular embodiment of the accumulator depicted in FIG. 12 is adapted for receiving incremental error signals from the embodiments shown in FIGS. 10 and 11, which generate an up/down (U/D') signal and a count enable (COUNT ENABLE) signal. The accumulator for use with the embodiment of FIG. 3 utilizes appropriate input circuitry to receive and filter a multiple bit incremental error signal corresponding to a quantized analog voltage level. It preferably also provides a reset signal when the incremental error exceeds a threshold.

In a further embodiment, an incremental error signal may be ignored if its frequency is very low, indicating a duty cycle locked condition that is within the tolerance of the duty cycle corrector 22. That is, if the duty cycle error is low enough that an error voltage develops very slowly, then it is preferable to ignore the occurrence of incremental error rather than to adjust the DAC of the duty cycle shaping circuit. Alternatively, a RESET signal may be provided to the incremental error detector at a relatively low frequency even in the absence of the incremental error exceeding a threshold.

In yet another preferred embodiment, the duty cycle corrector 22 provides a lock signal indicating that duty cycle lock has been achieved. The duty cycle lock signal may be provided when a transition occurs between an initial sequence of up signals (i.e., U/D' is a logic high) signals followed by a down signal (i.e., U/D' is a logic low), or between an initial sequence of down signals followed by a up signal. Alternatively, the lock signal may be provided when the frequency of incremental error signals is below a predetermined threshold (i.e., an incremental error signal is not being generated very often). Preferably, the lock signal may be provided as a status signal to other devices and circuits. The count filter 222 preferably generates the lock signal as shown in FIG. 12.

Figure 13:
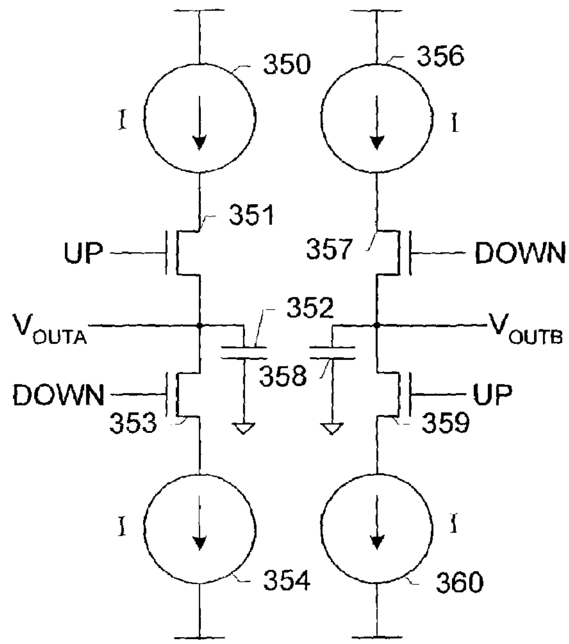
FIG. 13 is an alternative preferred embodiment of an error accumulator.

In a further embodiment, the error accumulator 32 may provide a duty cycle correction signal in the form of an analog signal representative of the accumulated error. The analog signal may be generated by storing a charge on one or more capacitors in response to the generation of an incremental error signal, where the stored voltage is representative of an accumulated error comprising the duty cycle correction signal. One such embodiment will be described with respect to FIG. 13. Current sources 350 and 354 are used to selectively charge and discharge, respectively, capacitor 352. Similarly, current sources 356 and 360 are used to selectively charge and discharge, respectively, capacitor 358. The control signals UP and DOWN are generated by, e.g., the U/D' signal, such that the UP signal is a logic high when U/D' is high, and the DOWN signal is high when U/D' is low. Upon the generation of an UP signal, FET 351 is turned on, allowing current to flow into capacitor 352, causing the voltage $V_{OUTA}$ to increase. The same UP signal will cause FET 359 to conduct, allowing current to flow out of capacitor 358 through current source 360, resulting in a decrease in the voltage $V_{OUTB}$ Thus, an UP signal results in an increase in the differential voltage ($V_{OUTA-VOUTB}$). Conversely, upon the generation of a DOWN signal, the differential voltage ($V_{OUTA-VOUTB}$) decreases due to the conduction of FETs 357 and 353. This differential voltage may be used to store an analog voltage that is then provided to the duty cycle shaping circuit 14, 15. In the embodiment of FIG. 4D, the voltage is provided to analog amplifier 77, which then steers current from nodes 70 and/or 72 to adjust the duty cycle.

In an alternative embodiment, a single ended voltage may be generated. In such an embodiment, a single capacitive element is charged and discharged to store a voltage representative of an accumulated error comprising the duty cycle correction signal.

In other embodiments, the duration of the UP and DOWN signals may be varied in response to the rate at which incremental error signals are generated. Specifically, if the time (as measured e.g., by a number of clock cycles) between the generation of incremental error signals is short, the duration of the corresponding control signal (either the UP or DOWN) can be increased, thereby allowing a greater change in the stored voltage. As the time between incremental error signals increases, the duration of the UP and DOWN signals may be decreased, allowing smaller changes in the stored voltage. Other signals or conditions may be used to control the duration of the UP and DOWN signals thereby controlling the sensitivity of the duty cycle correction signal. Such other signals include the occurrence of an UP signal after repeated occurrences of a DOWN signal, or the converse condition of the occurrence of a DOWN signal after repeated occurrences of an UP signal. Another condition is if the duty cycle corrector is in a fast-relock state as might be the case upon awakening from a nap or low power mode. Those of skill in the art will recognize that other conditions may also be used to alter the sensitivity of the adjustment to the duty cycle correction signal.

Figure 14:
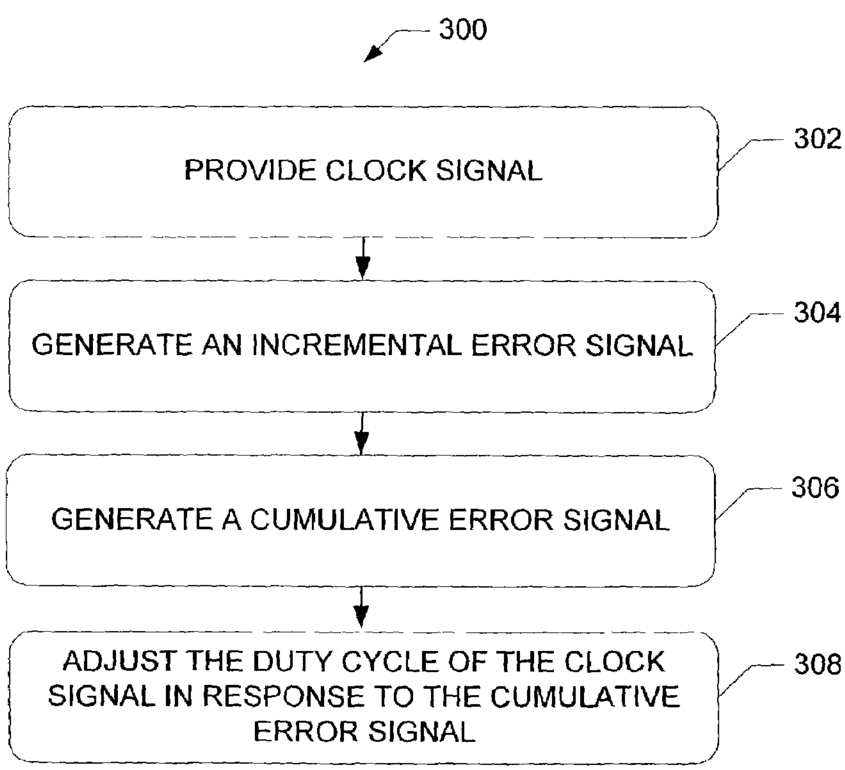
FIG. 14 is a preferred method of adjusting a clock duty cycle.

With respect to FIG. 14, an embodiment of a method of performing duty cycle correction will be described. The method 300 of adjusting a clock duty cycle begins at step 302 where a clock signal is provided. At step 304, an incremental error signal is generated in response to the clock signal. At step 306, a cumulative error signal is generated in response to the incremental error signal. Finally, at step 308, the duty cycle of the clock signal is adjusted in response to the cumulative error signal.

The step 304 of generating an incremental error signal may include the steps of generating an incremental duty cycle error voltage, which is compared to a first and second threshold voltage. In addition, the incremental error signal may have a logic value indicating whether the error is positive or negative. The step of generating an incremental duty cycle error voltage is preferably performed by a programmable charge pump, which also may include a DAC to provide programmability. Once the incremental error signal is generated, the incremental error signal is reset, but as discussed above, it may also be reset independent of generating an incremental error signal (or without otherwise adjusting the cumulative error signal). The incremental error signal may be reset by, for example, resetting of the charge pump voltage, (which provides an incremental duty cycle error voltage). Still further, the order of the steps of the method may be varied.

In alternative embodiments, the step of generating an incremental error signal may be performed by generating a duty cycle error voltage in response to the clock signal, and generating an incremental error signal having a binary quantization value representative of the differential voltage value. In this embodiment, the resetting of the incremental error signal is performed in response to the binary quantization value exceeding a digital threshold value, or upon action of the accumulator. The accumulator may determine whether or not to include the incremental error indication into the accumulated error value as discussed below.

The step 306 of generating a cumulative error signal in response to the incremental error signal may be performed by, for example, filtering the incremental error signal, altering a state of an error accumulator in response to the incremental error signal, or adjusting a counter value. The counter value may, for example, be incremented by large steps while in a fast lock mode, or it may be set according to a binary search algorithm. Alternatively, the cumulative error signal may be an analog voltage generated by charging and/or discharing one or more capacitors used to store a voltage, in response to the incremental error signal.

The step of adjusting the duty cycle of the clock signal (step 308) may be performed in a variety of ways. For example step 308 may be performed by adjusting a current steering circuit, adjusting a capacitance, or adjusting a comparator threshold voltage. In addition, the steps 304 through 310 may be performed iteratively until incremental error signals are no longer generated, or until their frequency of occurrence is below a predetermined threshold.

Figure 15A:
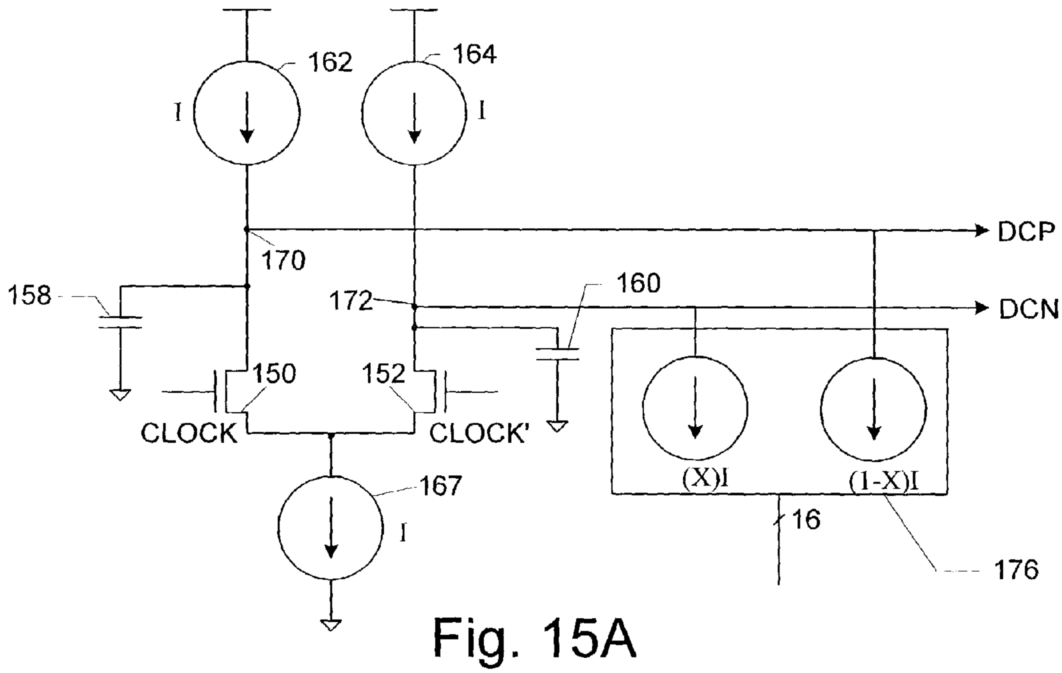
FIGS. 15A and 15B are generalized examples of programmable charge pumps.

With respect to FIG. 15A, one generalized charge pump and DAC configuration is considered to further demonstrate how a programmable charge pump may be used as incremental error detector 26 and DAC 30, as shown in FIGS. 2 and 3. In the embodiment depicted in FIG. 15A, the charge pump voltage is designed such that any duty cycle error will cause the capacitor voltage to change over time, and remain constant when the duty cycle has the desired ratio. The current in the capacitor is related to the instantaneous voltage change given by the relationship $I=C\ dv/dt$. For the charge pump operation, this may be generalized to $I=C\ \Delta v/\Delta t$, which yields $\Delta v=I/C\ \Delta t$. Thus, for the voltage to stay constant ($\Delta v=0$) at the desired duty cycle, the net current, or change in charge, over a given clock cycle (e.g., $\Delta t=1$ cycle) must be zero.

This may be achieved by the generalized circuit shown in FIG. 15A for a clock duty cycle ratio of X (where X is between 0 and 1), with a programmable DAC steering a current of $I(1-X)$ for the half of the charge pump that responds to the CLOCK signals, and steering a current of IX for the other half. Specifically, when the CLOCK signal is high, the current from current source 162 flows through current source 167, and summation of the currents at node 170 results in a current of $I(1-X)$ flowing out of capacitor 158. Since this current flows for a time period of $X\Delta t$ (e.g., the duty cycle ratio times the period of one cycle), the loss of charge in a cycle may be represented by $X\cdot I(1-X)$. When the CLOCK signal is low, summing the currents at node 170 indicates a current of $I-(1-X)\cdot I$ (which simplifies to IX) flows into capacitor 158 over a fraction $(1-X)$ of a cycle, for a gain of charge represented by $(1-X)I\cdot X$. As can be seen, there is no net change in the charge of capacitor 158 in this scenario, as long as the duty cycle is at the desired ratio X.

For the other half of charge pump shown in FIG. 15A, the analysis is similar. Because FET 152 is on for a time $(1-X)\Delta t$, and off for $X\Delta t$, the DAC current is programmed to be IX to provide a net current of zero at the desired duty cycle ratio of X. Therefore, note that the total current in DAC 176 is therefore $IX+I(1-X)$, or simply I.

Figure 15B:
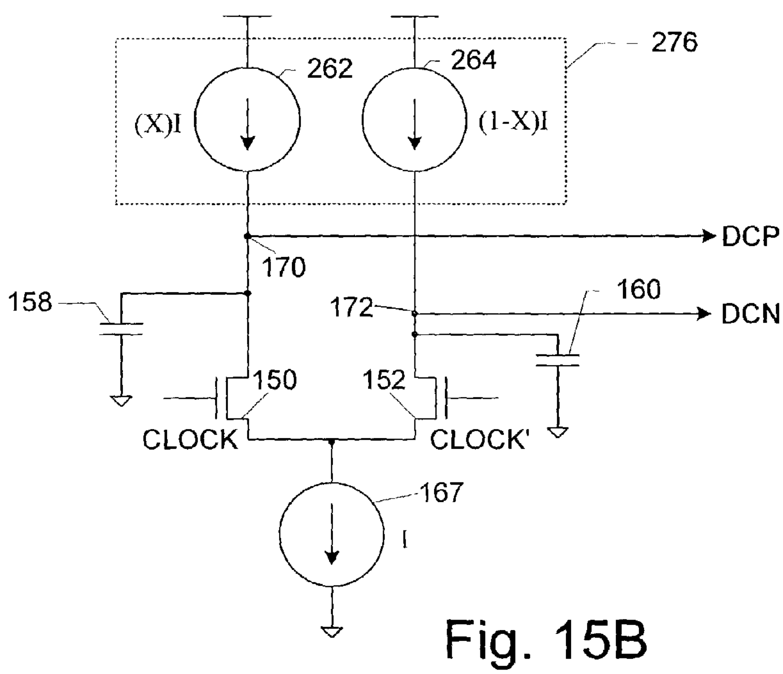

FIG. 15B depicts another embodiment, where the DAC is integrated into the charge pump as a programmable current source 276. An analysis similar to that presented above shows that when FET 150 is off, IX current flows into capacitor 158, for a gain of $IX(1-X)$ charge, and when FET 150 is on, $(I-IX)$ flows out of capacitor 158, for a loss of $X(1-X)$, for a zero net change in charge. This embodiment further allows the same common mode correction circuit to be used within the DAC. In FIGS. 15A and 15B, the programmable current sources 176, 276 may be implemented in a manner similar to DAC 120 shown in FIG. 6. More specifically, a binary control signal may turn on individual FETs, thereby enabling corresponding series-connected current sources to allow a programmable current to be provided by each current sources 262, 264.

In yet another embodiment, a variable duty cycle detector may be implemented without a DAC. In this embodiment, the rate at which the incremental error detector generates an incremental error is used as a measurement of the duty cycle. Specifically, after the incremental error detector is reset, the time it takes for the incremental error signal to be generated is determined (by way of a counter or other suitable timing mechanism). The time measurement is proportional to the duty cycle. Thus, a circuit may be designed, for example, with an incremental error detector that will not generate an error if the duty cycle is, say, 50%. On the other hand, any duty cycle error will cause an incrementally increasing voltage signal to be generated. Further, the sensitivity of the incremental error detector may be selected (statically, or programmably by way of a capacitive or current-steering DAC as disclosed herein), so that the rate of increase (or decrease) may be used to determine the duty cycle variance. For example, the incremental error detector may be designed (or programmed) such that a duty cycle of 0.45 will cause an incremental error signal to be generated in 100 cycles. Because the relationship is generally geometric in nature, a duty cycle of 0.4 will cause an incremental error signal to be generated in 50 cycles, and a duty cycle of 0.35 will cause an incremental error signal to be generated in 25 cycles, etc. In this way, a desired duty cycle may be obtained by providing a cumulative error signal to a clock waveform shaper sufficient to generate a CLOCK signal that will induce the generation of an incremental error signal in the appropriate time frame. The desired programmable range and desired sensitivity may be set by the selection of component values (current sources and capacitors) and by providing programmability by way of a DAC as disclosed herein.

It should be noted that all of the exemplary embodiments are only for illustrative purposes, and actual circuit designs may take into account the particular desired range of programmable duty cycles, the desired sensitivity of the detector, the level of accuracy of the control feedback loop, the need for certain bias currents, and the current source values that are desired and easily implemented.

In the above description it is contemplated that signals transmitted between the functional blocks may be sent directly, or may be slightly modified prior to reception by the receiving block. That is, a signal may be amplified, attenuated, delayed, latched, buffered, inverted, filtered, digitized, level shifted or otherwise converted, etc., between the sending and receiving logic blocks. The description of the above embodiments should be interpreted to include equivalent signals, where the informational and/or functional aspect of the signals determines equivalence. Thus, the description above contemplates embodiments where the signal transmitted by one block is altered, thereby generating a derived signal that is received by another block.

Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. For example, the DAC converter 76 of the duty cycle shaping circuit may alternatively be grouped with the duty cycle corrector circuit 22. Similarly, the error accumulator 32, 40 may be combined with the duty cycle detector 21, 24, 27. The ADC 28, 42 may be combined with the error accumulator 32, 40. Still further, both the decoder 226 and the count register 224 may be combined with the counter filter 222. Numerous other examples will be apparent to those of skill in the art.

Although the transistors of the above-described embodiments are MOSFETs, those skilled in the art will recognize that other types of transistors (e.g., bipolar transistors, IGFETs, etc.) and other circuits configured to perform similar functions may be used where appropriate. Various waveform shaping circuits, DACs, ADCs, and error accumulators or filters have been described, yet still others may be used, as will be appreciated by those of skill in the art. Additionally, as used herein, signal names may also refer to the nodes that carry the signals, and node names may also refer to the signals carried thereon.

While the invention has been described in connection with a number of exemplary embodiments, the foregoing is not intended to limit the scope of the invention to a particular form, circuit arrangement, or semiconductor topology. To the contrary, the invention is intended to include such alternatives, modifications and variations as may be apparent to those skilled in the art upon reading the foregoing detailed description.

What is claimed:

1. A duty cycle adjuster comprising:

a clock generator configured to generate a clock signal and having a duty cycle correction input;

a duty cycle detector configured to generate an incremental error measurement in the presence of a duty cycle error in the clock signal, said duty cycle detector comprising a charge pump including a first and second capacitor and a switch in between said first and second capacitors, and an analog to digital converter configured to generate said incremental error measurement when a voltage difference across said first and second capacitors exceeds a threshold, and wherein said switch minimizes said voltage difference in response to a reset signal;

a duty cycle error accumulator connected to said duty cycle detector, wherein said duty cycle error accumulator is configured to generate a duty cycle correction signal representing an accumulated error measurement in response to said incremental error measurement, said duty cycle error accumulator providing the duty cycle correction signal to is said duty cycle correction input.

2. The duty cycle adjuster of claim 1, wherein the duty cycle adjuster is incorporated on a monolithic integrated circuit, wherein said clock signal has a rising edge and a falling edge and wherein said monolithic integrated circuit is adapted to transfer data on both rising and failing edges of the clock signal.

3. The duty cycle adjuster of claim 1 wherein said duty cycle detector is resettable.

4. The duty cycle adjuster of claim 3, where said duty cycle adjuster is configured to reset the duty cycle detector after the incremental error measurement is generated.

5. The duty cycle adjuster of claim 1 wherein said incremental error measurement is in the form of a logic value, and wherein the logic value is selected from a first logic value which is indicative of a positive error and a second logic value which is indicative of a negative error.

6. The duty cycle adjuster of claim 1 wherein said duty cycle detector is programmable.

7. The duty cycle adjuster of claim 1 wherein said duty cycle detector comprises a charge pump and a digital to analog converter connected to said charge pump, said digital to analog converter having a digital input for duty cycle selection.

8. The duty cycle adjuster of claim 7 wherein said digital to analog converter is configured to adjust the charge and discharge rates of said charge pump.

9. The duty cycle adjuster of claim 7 wherein said digital to analog converter comprises a current steering circuit.

10. The duty cycle adjuster of claim 7 wherein said digital to analog converter comprises a plurality of capacitors, wherein said digital to analog converter is configured such that each of said capacitors is independently and selectively enabled.

11. The duty cycle adjuster of claim 1 wherein said duty cycle error accumulator comprises a digital counter.

12. The duty cycle adjuster of claim 11 wherein said digital counter has an adjustable counting increment.

13. The duty cycle adjuster of claim 12 wherein said counting increment is adjusted to increase the convergence of the duty cycle adjuster.

14. The duty cycle adjuster of claim 11 wherein said digital counter is settable to an initial value.

15. The duty cycle adjuster of claim 1 wherein said duty cycle error accumulator comprises a digital filter.

16. The duty cycle adjuster of claim 15 wherein said digital filter is nonlinear.

17. The duty cycle adjuster of claim 1 wherein said duty cycle error accumulator comprises a digital state machine.

18. The duty cycle adjuster of claim 17 wherein said digital state machine has a sleep state.

19. The duty cycle adjuster of claim 17 wherein said digital state machine has a fast lock state.

20. The duty cycle adjuster of claim 17 wherein said digital state machine is configured to increment said duty cycle correction signal by an amount responsive to the time in which said incremental error measurement is generated.

21. The duty cycle adjuster of claim 1 wherein said duty cycle correction signal is a digital signal.

22. The duty cycle adjuster of claim 1 wherein said duty cycle error accumulator comprises at least one capacitor, and wherein said duty cycle correction signal is an analog signal.

23. The duty cycle adjuster of claim 1 wherein said duty cycle detector generates a fine duty cycle adjustment signal, and wherein said duty cycle detector also provides the fine duty cycle correction signal to said duty cycle correction input.

24. A duty cycle adjuster comprising:

a clock generator comprising a duty cycle shaping circuit and a clock waveform circuit, wherein said duty cycle shaping circuit comprises a first capacitor, a second capacitor, a differential amplifier connected to said first and second capacitors, and a digital to analog converter connected to said differential amplifier, and wherein the clock generator is configured to generate a clock signal and having a duty cycle correction input;

a duty cycle detector configured to generate an incremental error measurement in the presence of a duty cycle error in the clock signal;

a duty cycle error accumulator connected to said duty cycle detector, wherein said duty cycle error accumulator is configured to generate a duty cycle correction signal representing an accumulated error measurement in response to said incremental error measurement, said duty cycle error accumulator providing the duty cycle correction signal to said duty cycle correction input; and, wherein said digital to analog converter is configured to receive said duty cycle correction signal, responsively adjust current flow to at least one of said first and second capacitors, and to thereby adjust the rates of change of voltages on at least one of said first and second capacitors.

25. The duty cycle adjuster of claim 24 wherein said duty cycle shaping circuit comprises a first capacitor, a second capacitor, a differential amplifier connected to said first and second capacitors, and a digital to analog converter connected to said differential amplifier, wherein said digital to analog converter is configured to receive said duty cycle correction signal, responsively adjust a capacitive value of at least one of said first and second capacitors, and to thereby adjust the rates of change of voltages on at least one of said first and second capacitors.

26. The duty cycle adjuster of claim 24 wherein said clock waveform circuit comprises an operational amplifier.

27. A duty cycle adjuster comprising:

a clock generator configured to provide a clock signal and having a duty cycle correction input;

a duty cycle detector comprising a charge pump including a first and second capacitor and a switch in between said first and second capacitors, configured to generate a voltage in the presence of a duty cycle error in the clock signal, and an analog to digital converter including a comparator connected to said charge pump, wherein said analog to digital converter is configured to generate a digital incremental error measurement responsive to said voltage; and a duty cycle error accumulator connected to said duty cycle detector, wherein said duty cycle error accumulator is configured to generate a duty cycle correction signal representing an accumulated error measurement in response to said digital incremental error measurement, said duty cycle error accumulator providing said duty cycle correction signal to said duty cycle correction input;

wherein said charge pump is selectively resettable via said switch and configured to maintain said voltage substantially within a predetermined range when said duty cycle correction signal is sufficient to obtain a desired duty cycle.

28. The duty cycle adjuster of claim 27, wherein the duty cycle adjuster is integrated on a monolithic integrated circuit, wherein said clock signal has a rising edge and a falling edge and wherein said the monolithic integrated circuit is adapted to transfer data on both rising and falling edges of the clock signal.

29. The duty cycle adjuster of claim 27 wherein said digital incremental error measurement is a multiple bit signal representing a quantization value corresponding to said voltage.

30. The duty cycle adjuster of claim 27 wherein said digital incremental error measurement is in the form of a logic value, and wherein the logic value is selected from a first logic value which is indicative of a positive error and a second logic value which is indicative of a negative error.

31. The duty cycle adjuster of claim 30 wherein said switch is configured to reset said charge pump in response to said first and second logic values.

32. The duty cycle adjuster of claim 27 wherein said clock generator comprises a duty cycle shaping circuit and a clock waveform circuit.

33. The duty cycle adjuster of claim 32 wherein said duty cycle shaping circuit comprises a first capacitor, a second capacitor, a differential amplifier connected to said first and second capacitors, and a digital to analog converter connected to said differential amplifier, wherein said digital to analog converter is configured to receive said duty cycle correction signal, responsively adjust current flow to at least one of said first and second capacitors, and thereby adjust the rates of change of voltages on at least one of said first and second capacitors.

34. The duty cycle adjuster of claim 32 wherein said duty cycle shaping circuit comprises a first capacitor, a second capacitor, a differential amplifier connected to said first and second capacitors, and a digital to analog converter connected to said differential amplifier, wherein said digital to analog converter is configured to receive said duty cycle correction signal, responsively adjust a capacitive value of at least one of said first and second capacitors, and thereby adjust the rates of change of voltages on said first and second capacitors.

35. The duty cycle adjuster of claim 32 wherein said clock waveform circuit comprises an operational amplifier.

36. The duty cycle adjuster of claim 32 wherein said digital to analog converter comprises a plurality of capacitors, wherein said digital to analog converter is configured such that each of said capacitors is independently and selectively enabled.

37. The duty cycle adjuster of claim 27 wherein said duty cycle detector is programmable.

38. The duty cycle adjuster of claim 27 wherein said duty cycle detector further comprises a second digital to analog converter connected to said charge pump, said second digital to analog converter having a digital input for duty cycle selection.

39. The duty cycle adjuster of claim 38 wherein said second digital to analog converter is configured to adjust the charge and discharge rates of said charge pump.

40. The duty cycle adjuster of claim 38 wherein said second digital to analog converter comprises a current steering circuit.

41. The duty cycle adjuster of claim 27 wherein said duty cycle error accumulator comprises a digital counter.

42. The duty cycle adjuster of claim 41 wherein said digital counter has an adjustable counting increment.

43. The duty cycle adjuster of claim 41 wherein said digital counter is settable to an initial value.

44. The duty cycle adjuster of claim 27 wherein said duty cycle error accumulator comprises a digital filter.

45. The duty cycle adjuster of claim 44 wherein said digital filter is nonlinear.

46. The duty cycle adjuster of claim 27 wherein said duty cycle error accumulator comprises a digital state machine.

47. The duty cycle adjuster of claim 46 wherein said digital state machine has a sleep state.

48. The duty cycle adjuster of claim 46 wherein said digital state machine has a fast lock state.

49. The duty cycle adjuster of claim 46 wherein said digital state machine is configured to increment said duty cycle correction signal by an amount responsive to the speed at which said incremental error measurement is generated.

50. A method of adjusting the duty cycle of a clock comprising the steps of:

providing a clock signal to a charge pump having a first and second capacitor, and a switch connected between said first and second capacitor;

generating an incremental error signal at a comparator having a threshold in response to the clock signal when a voltage difference across said first and second capacitors exceeds said threshold, and wherein said switch minimizes a voltage difference in response to a reset signal;

generating a cumulative error signal in response to the incremental error signal; and adjusting the duty cycle of the clock signal in response to the cumulative error signal.

51. The method of claim 50 wherein the step of generating an incremental error signal comprises the step of:

generating an incremental error signal having a logic value indicating whether the error is positive or negative.

52. The method of claim 51 wherein the step of generating an incremental duty cycle error voltage is performed by a programmable charge pump.

53. The method of claim 52 wherein the programmable charge pump includes a digital to analog converter.

54. The method of claim 50 wherein the step of generating an incremental error signal comprises the steps of:

generating a voltage in response to the clock signal; and generating an incremental error signal having a digital quantization value representative of the differential voltage value.

55. The method of claim 54 further comprising the step of resetting the incremental error signal when the digital quantization value exceeds a digital threshold value.

56. The method of claim 50 wherein the step of generating a cumulative error signal in response to the incremental error signal comprises filtering the incremental error signal.

57. The method of claim 50 wherein the step of generating a cumulative error signal in response to the incremental error signal comprises altering a state of an error accumulator in response to the incremental error signal.

58. The method of claim 50 wherein the step of generating a cumulative error signal in response to the incremental error signal comprises adjusting a counter value.

59. The method of claim 58 wherein the counter value is incremented by a step size selected from a plurality of step sizes.

60. The method of claim 58 wherein the counter value is set according to a binary search algorithm.

61. The method of claim 50 wherein the step of adjusting the duty cycle of the clock signal in response to the cumulative error signal comprises adjusting a current steering circuit.

62. The method of claim 50 wherein the step of adjusting the duty cycle of the clock signal in response to the cumulative error signal comprises adjusting a capacitance.

63. The method of claim 50 wherein the step of adjusting the duty cycle of the clock signal in response to the cumulative error signal comprises adjusting a threshold voltage.

64. The method of claim 50 wherein the steps of generating an incremental error signal, generating a cumulative error signal, resetting the incremental error signal, and adjusting the duty cycle of the clock signal are repeatedly performed.

65. The method of claim 50 further comprising the steps of: generating a fine duty cycle adjustment signal; and adjusting the duty cycle of the clock signal in response to the fine duty cycle adjustment signal.

66. A duty cycle adjuster comprising:

a clock generator configured to generate a clock signal and having a duty cycle correction input;

a duty cycle detector configured to generate an incremental error measurement in response to an incremental error voltage exceeding a threshold, wherein the duty cycle detector generates a fine duty cycle correction signal, said duty cycle detector providing the fine duty cycle correction signal to said duty cycle correction input; and a duty cycle error accumulator connected to said duty cycle detector; wherein said duty cycle error accumulator is configured to generate a duty cycle correction signal representing an accumulated error measurement in response to said incremental error measurement, said duty cycle error accumulator providing the duty cycle correction signal to said duty cycle correction input; wherein the duty cycle detector is configured to reset the incremental error voltage when the incremental error measurement reaches a threshold value.

67. The duty cycle adjuster of claim 66 wherein the fine duty cycle correction signal is an analog voltage.

68. The duty cycle adjuster of claim 66 wherein the fine duty cycle correction signal is a digital signal.

69. The duty cycle adjuster of claim 68 wherein the duty cycle correction signal is a digital signal.

70. The duty cycle adjuster of claim 69 wherein the clock generator comprises a digital-to-analog converter having said duty cycle correction input, and said duty cycle correction signal and said fine duty cycle correction signal control said digital-to-analog converter.

71. The duty cycle adjuster of claim 66 wherein the clock generator comprises a first current steering circuit for receiving said duty cycle correction signal and a second current steering circuit for receiving said fine duty cycle correction signal.

72. The duty cycle adjuster of claim 71 wherein the first and second current steering circuits are both analog amplifiers.

73. The duty cycle adjuster of claim 71 wherein the first current steering circuit is a digital-to-analog converter, and said second current steering circuit is an analog amplifier.

74. A method of adjusting the duty cycle of a clock comprising the steps of:

providing a clock signal;

generating an incremental error signal in response to the clock signal;

generating a cumulative error signal in response to the incremental error signal;

generating a fine adjustment signal in response to the clock signal;

adjusting the duty cycle of the clock signal in response to the cumulative error signal and the fine adjustment signal.

75. The method of claim 74 wherein the step of generating an incremental error signal comprises:

generating an error voltage in response to the clock signal;

generating an incremental error signal when the error voltage exceeds a threshold; and, resetting the error voltage;

and wherein the fine adjustment signal is generated in response to the error voltage.

76. The method of claim 74 wherein the step of adjusting the duty cycle of the clock signal in response to the cumulative error signal and the fine adjustment signal comprises:

adjusting a first current steering circuit in response to the cumulative error signal; and, adjusting a second current steering circuit in response to the fine adjustment signal.

77. The method of claim 76 wherein at least one of the first and second current steering circuits is a digital-to-analog converter.

78. The method of claim 76 wherein at least one of the first and second current steering circuits is an analog amplifier.

* * * * *